United States Patent [19]
Robinson et al.

[11] Patent Number: 5,853,300
[45] Date of Patent: Dec. 29, 1998

[54] WATTHOUR SOCKET ADAPTER WITH IMPROVED ELECTRICAL CONNECTIONS

[75] Inventors: Darrell Robinson, Highland Township; Robert O. Learmont, Walled Lake; Karl R. Loehr, Novi; Allen V. Pruehs, Howell; Keith C. Dropiewski, Walled Lake, all of Mich.

[73] Assignee: Ekstrom Industries, Inc., Farmington Hills, Mich.

[21] Appl. No.: 656,774

[22] Filed: Jun. 3, 1996

Related U.S. Application Data

[63] Continuation-in-part of Ser. No. 521,009, Aug. 30, 1995, Pat. No. 5,577,933, which is a continuation of Ser. No. 215,915, Mar. 22, 1994, abandoned, and Ser. No. 521,008, Aug. 10, 1995, Pat. No. 5,571,031.

[51] Int. Cl.$^6$ ........................................ H02B 1/00
[52] U.S. Cl. .......................... 439/517; 361/669; 439/814; 439/907
[58] Field of Search ................................ 439/508, 517, 439/814, 856, 907; 361/668–670

[56] References Cited

U.S. PATENT DOCUMENTS

| | | | |
|---|---|---|---|
| Re. 34,531 | 2/1994 | Bell et al. | 439/135 |
| 1,645,539 | 10/1927 | Mau | 439/866 |
| 2,030,522 | 2/1936 | Johansson | 439/508 |
| 2,911,616 | 11/1959 | Townsend | 439/866 |
| 3,050,706 | 4/1962 | Kitscha | 439/907 |
| 3,061,763 | 10/1962 | Ekstrom | 439/517 |
| 3,066,204 | 11/1962 | Mobarry | 439/907 |
| 3,221,216 | 11/1965 | Kubryner | 361/669 |
| 3,657,683 | 4/1972 | Grieshaber | 439/907 |
| 4,213,669 | 7/1980 | Wittes | 439/811 |
| 4,772,213 | 9/1988 | Bell et al. | 439/135 |
| 4,823,572 | 4/1989 | Signorelli | 70/163 |
| 4,892,485 | 1/1990 | Patton | 439/517 |
| 5,088,004 | 2/1992 | Nowell | 361/659 |
| 5,145,403 | 9/1992 | Schaffert et al. | 439/508 |
| 5,181,166 | 1/1993 | Howell | 361/364 |
| 5,207,595 | 5/1993 | Learmont et al. | 439/517 |
| 5,571,031 | 11/1996 | Robinson et al. | 439/517 |
| 5,588,874 | 12/1996 | Pruehs et al. | 439/517 |

OTHER PUBLICATIONS

Grote & Hartmann, Product Catalog, 1993.
Long Life For Power Contacts, Machine Design, Jan. 11, 1990.
Series Reconnect Devices Series SRD–S1900, Scientific Atlanta Instrumentation Group, 1992.

*Primary Examiner*—Neil Abrams
*Attorney, Agent, or Firm*—Young & Basile, PC

[57] ABSTRACT

A watthour meter socket adapter 310 includes a plurality of current jaw contacts 290 and potential jaw contacts 10 mounted between front and rear housings 314, 312, with each jaw contact 290, 10 surrounding by a receptacle 422, 70 in the front housing 314. An aperture in each receptacle 422, 70 allows insertion of a meter blade terminal into the jaw contact. An electrical conductor extends from each jaw contact 290, 10 to an individual terminal 102 mounted in a terminal portion of the front and rear housings 314, 312. Apertures in the front housing 314 allow insertion of a tool into engagement with a fastener 112 carried on each terminal 290, 10 for fixedly joining a terminal clip 116 mounted a conductor 132 extending from the jaw contacts to an external conductor 138 inserted through openings in the bottom of the front and rear housings. The potential jaw contacts 10 are in the form of three linearly spaced fingers 12, 14, 20, with two of the fingers 12, 14 being spaced apart by an intermediate third finger 20, and projecting to one side of the jaw contact, opposite from the outer end of the intermediate, third finger to define a slot for receiving a potential meter blade terminal. A flange 30 and a tab 42 are formed on each potential jaw contact 10 for attaching a plurality of external conductors 44, 41 to each potential jaw contact 10. Another set of apertures formed in the front housing 314 allow access of at least a pair of electrically connected shorting pins 164 coupled to two terminal clips 116 and aligned with the apertures to electrically connect a pair of electrical conductors, jaw contacts and terminals in the housing.

43 Claims, 9 Drawing Sheets

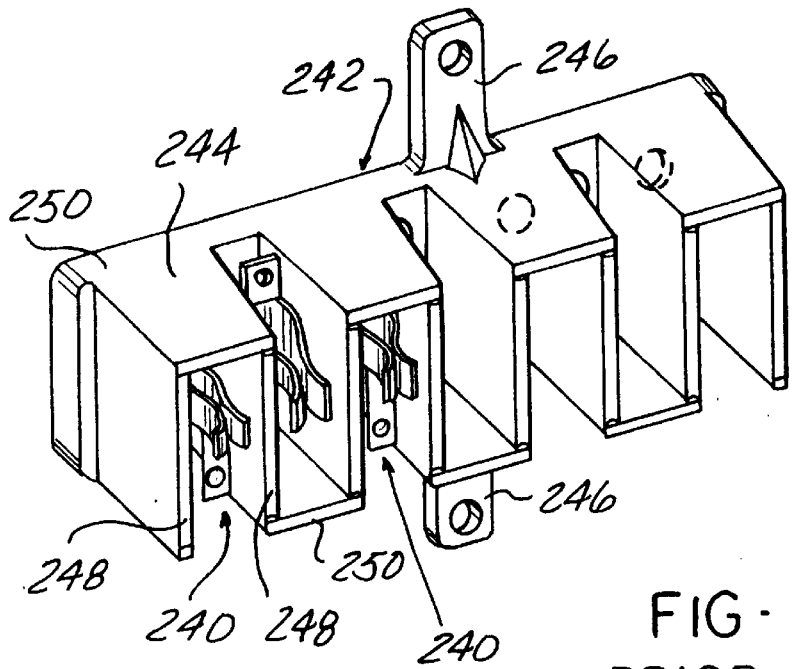
FIG·1
PRIOR ART
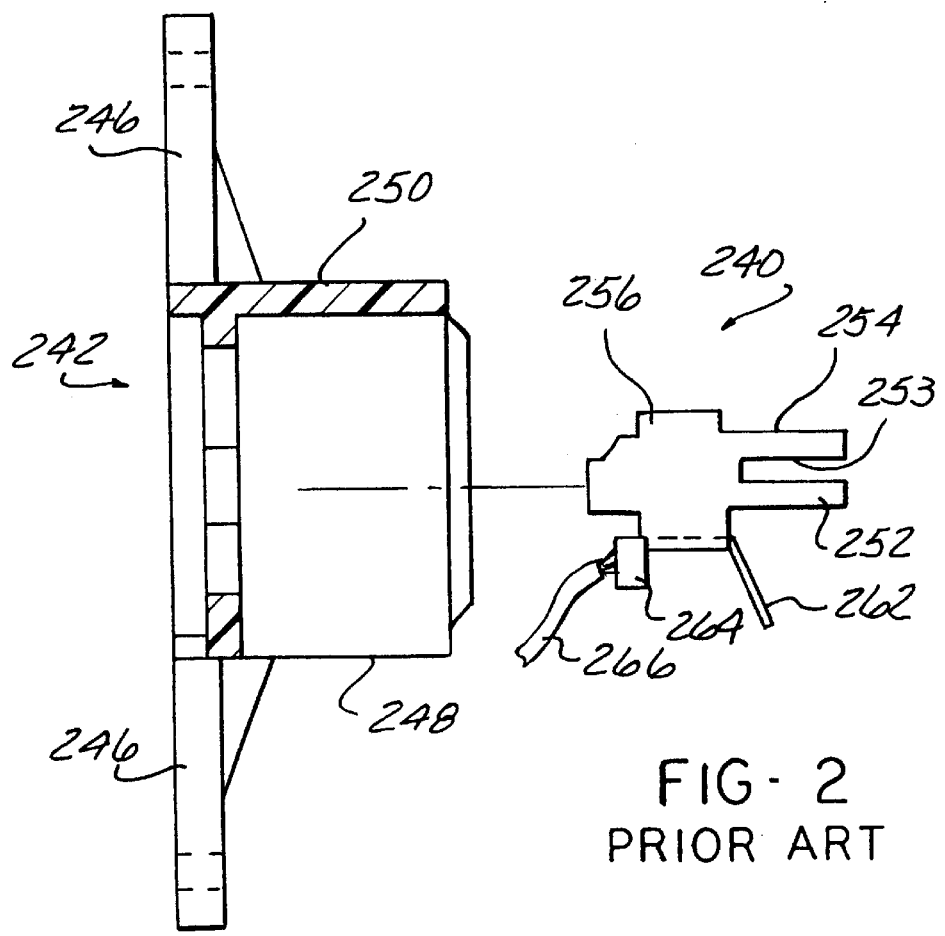
FIG·2
PRIOR ART

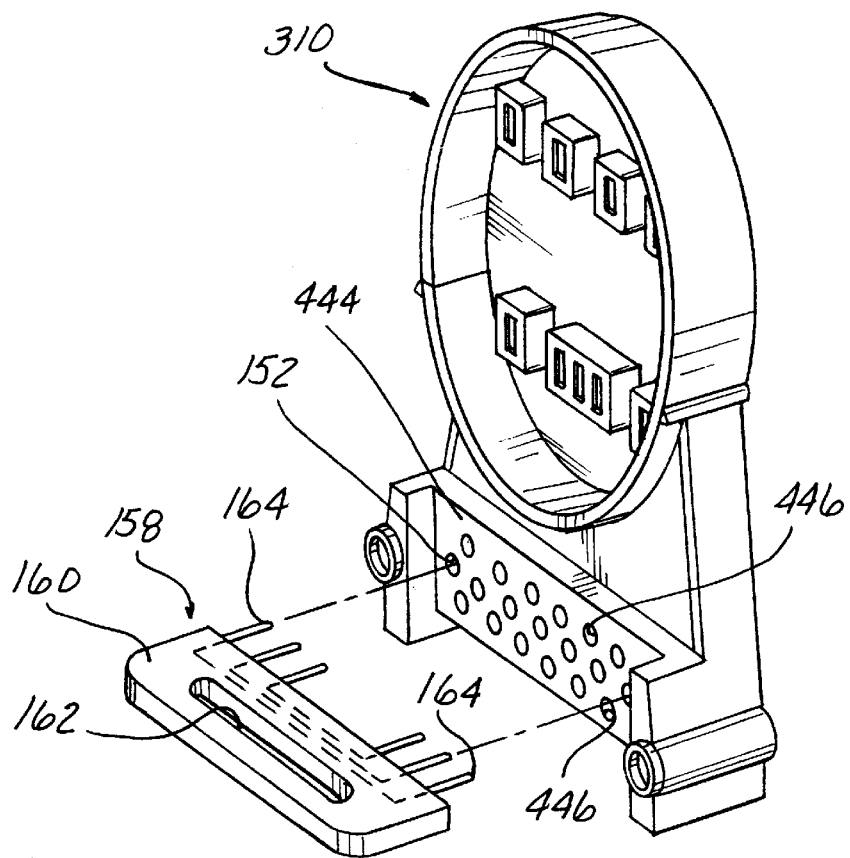
FIG·14
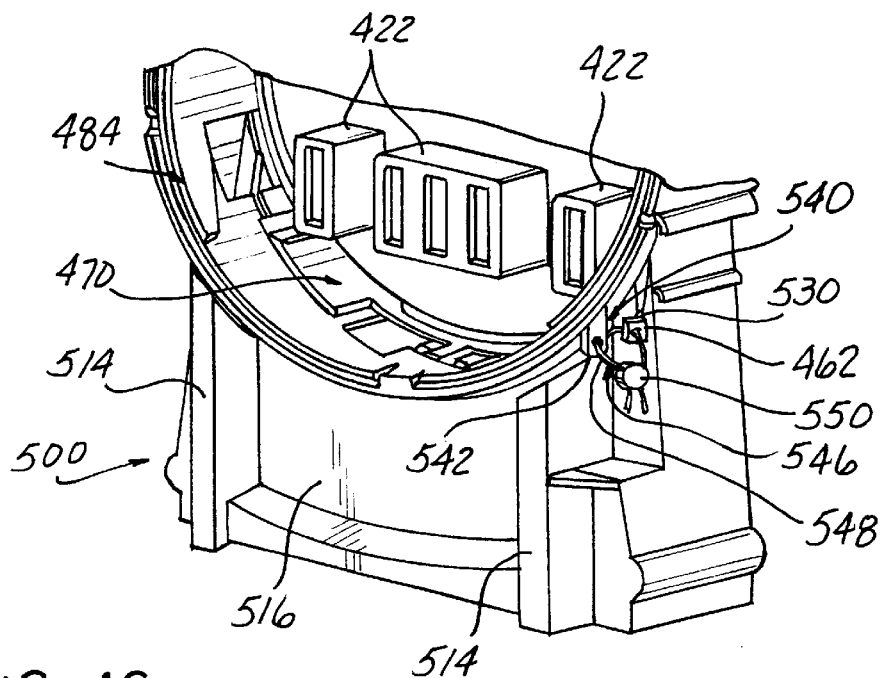
FIG·16

3,853,300

WATTHOUR SOCKET ADAPTER WITH IMPROVED ELECTRICAL CONNECTIONS

CROSS-REFERENCE TO RELATED APPLICATIONS

This application is a continuation-in-part of co-pending application, Ser. No. 08/521,009, filed Aug. 30, 1995 in the name of Darrell Robinson et al and entitled "WATTHOUR METER MOUNTING APPARATUS WITH SAFETY SHIELD," now U.S. Pat. No. 5,577,933, which is a continuation of Ser. No. 08/215,915 filed Mar. 22, 1994, now abandoned and application, Ser. No. 08/521,008, filed Aug. 10, 1995, now U.S. Pat. No. 5,571,031.

BACKGROUND OF THE INVENTION

Field of the Invention

The present invention relates, in general, to electrical watthour meters and, more specifically to watthour meter mounting enclosures.

In the electric utility industry, plug-in, socket-type watthour meters are commonly employed to measure electrical power consumption at a residential or commercial building establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts receive blade terminals on a plug-in watthour meter to complete an electric circuit through the meter between the line and load terminals mounted in the cabinet for the measurement of electrical power consumption.

S-type, socket-type, plug-in watthour meters have replaced older A base bottom connected meters which were formed of a single piece housing in which the watthour meter was fixedly mounted along with compression terminals which provide connection to the utility power lines and the building load distribution network.

In an installation involving an A-type bottom connected meter, an A to S socket adapter is used to allow a new S-type watthour meter to be installed. The socket type meter has outwardly extending blade terminals which are insertable into the jaw contacts in the cabinet of an S-type meter socket. The socket adapter includes its own set of female jaw contacts which receive the male blade terminals of the S-type plug-in, socket-type meter.

A socket extender adapter used to convert a ringless style socket to a ring-type socket has a similar arrangement of contacts and terminals to plug-in to a socket and to receive an S-type, plug-in, socket-type meter.

While it is typical for a watthour meter, once it is installed in a socket or socket and socket adapter, to remain in service for many years, it is still necessary for such meters to be removed for repair or replacement from time to time as well as to temporarily disconnect electrical service to a particular customer. During the installation and removal of the watthour meter from the socket or socket adapter, the electric power line terminals in the socket or socket adapter remain connected to the electric utility power line conductors and carry potential. The utility employee installing or removing the watthour meter may inadvertently touch such contacts thereby raising the possibility of injury. Furthermore, an inadvertent short across the contacts caused by a tool contacting the contacts or a full fault caused by a 90° offset insertion of the meter can cause a spark or flash which could damage the watthour meter installation as well as posing a significant risk of injury to the utility employee.

Various flash covers or shields have been devised as separate attachments to cover a portion of the jaw contacts in a watthour meter socket or socket adapter as shown in U.S. Pat. No. 5,145,403.

A similar flash cover or shield is shown in FIG. 17 of co-pending application Ser. No. 08/521,009, and has a flat front cover containing slots which are aligned with the jaw contacts and receive the watthour meter terminals therethrough. Rearward facing legs extend from the upper and lower portions of the cover and space the cover from the back wall of the socket or socket adapter.

Both types of flash or safety shields provide some measure of flash protection in that they cover a portion of the jaw contacts thereby reducing the possibility of inadvertent contact with such contacts by the meter installer or portions of the meter during installation or removal of the meter from the socket or socket adapter. However, such previously devised flash covers or shields do not completely surround all exposed portions of the jaw terminals. Thus, such exposed portions may still be inadvertently touched by a utility employee or, in the event of a fault or a short, a spark or flash could still occur.

Current transformer or CT rated watthour meters and socket adapters are employed in high current applications. Current transformers coupled to the line and load conductors have their output leads connected to terminals in a current transformer or CT rated watthour meter socket adapter. A low current rated watthour meter is then plugged into the socket adapter to measure power consumed at the building site.

In addition, potential coils in a watthour meter may also be connected via potential blade terminals into potential jaw contacts mounted in the socket adapter and connected by individual conductors to terminals mounted in the terminal portion of the socket adapter. In such a watthour meter socket adapter, a problem is frequently encountered in that individual stranded conductors extending from the line and load jaw contacts or from the potential jaw contacts to the terminals can become frayed and break off after successive connections.

As shown in FIGS. 1 and 2, such potential terminals 240 are mounted in a potential terminal block 242 fixed in the socket adapter housing. The terminal block 240 is in the form of a housing 244 of an electrically insulating material and has a pair of outwardly extending flanges 246 which receive suitable fasteners to mount the housing 244 to the base of the socket adapter housing. The housing 244 is formed with a plurality of spaced dividers 248 which are alternately connected on opposite ends by end walls 250. The dividers 248 and end 250 walls form a series of co-linear slots in each of which a potential terminal 240 is mounted in a snap-in connection.

Each potential terminal 240 typically includes a pair of spaced jaw contacts 252, 254 which are formed as extensions of a pair of spaced side walls, 256, only one of which is shown.

The side walls 256 are interconnected by an end wall which has a perpendicular quick connect tab or flange 262 extending therefrom for receiving a fast-on connector attached to an external conductor. Optionally, an aperture is formed in the tab 262 for receiving a self-tapping screw, not shown, to attach an external conductor to the tab 262. A wire crimp collar 264 is integrally formed on the end wall 260 interiorly between the side walls 256, 258 and is designed to be crimped around one end of a potential wire 266. The opposite end of the wire 266 is connected to one of the potential terminals, not shown, in the terminal portion of the socket adapter. Further details of the potential terminals can be had by referring to FIGS. 26–28 and the related description in U.S. Pat. No. 5,571,031.

Another problem encountered with current transformer rated socket adapters is the necessity of short circuiting the line and load socket adapter terminals when the watthour meter is removed for replacement or testing. Heretofore, elaborate test switch devices have been incorporated into the CT rated socket adapter to provide the necessary short circuit feature.

Thus, it would be desirable to provide a safety shield for an electrical watthour meter apparatus which completely encloses all portions of the jaw contacts in a watthour meter mounting device, such as a socket, socket adapter, socket extender, etc., to prevent inadvertent contact with such jaw contacts or to prevent a short between such contacts which could lead to a spark or flash. It would also be desirable to provide such a safety shield which can be easily incorporated into the design of a new watthour meter socket, or watthour meter socket adapter, or installed as a separate component in an existing watthour meter socket or socket adapter.

It would also be desirable to provide a potential jaw contact design which simplifies the connection of external wires to the potential jaws. It would also be desirable to provide a current transformer rated watthour meter socket adapter which has provisions for easy routing of external wires through the housing of the socket adapter between the potential terminals. In previously devised conductors for socket adapters, the jaw contacts have been attached to the conductors by threaded fasteners. This involves labor intensive and costly manufacturing operations in order to prepare the threaded apertures in the conductors and the contacts and to insert and tighten the fasteners. Thus, it would be desirable to provide a current and potential jaw contact design for a watthour meter socket adapter which requires less labor for manufacturing and assembly and thereby has a reduced cost and greater reliability.

It would also be desirable to provide a current transformer rated socket adapter which has a unique and simplified current transformer bypass feature to short out the current transformers when the watthour meter is removed from the socket adapters. Finally, it would also be desirable to provide a current transformer rated watthour meter socket adapter which has electrical connections operative to prevent fraying or breakage of individual electrical conductor strands.

SUMMARY OF THE INVENTION

The present invention is an electric watthour meter mounting apparatus and, in particular, a polyphase, current transformer rated watthour meter socket adapter which includes a flash or safety shield for completely covering all exposed portions of the jaw contacts in the watthour mounting apparatus to prevent inadvertent contact with such contacts by the meter installer or by a tool which leads to a short circuit or a full fault caused by a 90° offset insertion of the meter, both of which conditions could cause a dangerous spark or flash.

The apparatus includes a housing having a watthour meter receiving portion and a terminal portion spaced from the watthour meter receiving portion. A plurality of terminals are mounted in the terminal portion and connected to line conductors and load conductors. A plurality of jaw-type electrical contacts are mounted in the watthour meter receiving portion, each jaw contact receiving a blade terminal of a watthour meter in a snap-in connection. Electrical conductors are connected between the jaw contacts and the terminals. Means are formed on or mounted in the housing for completely covering the electrical conductors and the contacts in the housing.

The covering means preferably comprises the housing being formed of first and second plates, one having an annular side wall extending outward therefrom. The first and second plates are spaced apart, when joined together, to define an interior cavity. The electrical conductors are disposed in the cavity and are completely enclosed by the first and second plates and the annular side wall. A plurality of hollow receptacles are formed in the first plate and extend outward from the first plate. The interior of each receptacle opens to the interior cavity between the first and second plates and receives a jaw contact therein. A slot is formed in each receptacle for receiving a blade terminal of a watthour meter therethrough to enable the blade terminal to be inserted into an underlying jaw contact. Each receptacle is formed with closed side walls and an outer end wall to completely surround all portions of the jaw contact housed therein.

A plurality of potential jaw contacts are mounted in the socket adapter housing. The potential jaw contacts are disposed in separate receptacles formed in the first plate of the housing.

Each potential jaw contact includes a base, first and second spaced, substantially co-planar, angularly bent jaws extending from the base, and a third angularly bent jaw extending from the base and disposed between the first and second jaws, an outer end of the third jaw spaced from outer ends of the first and second jaws to define a watthour meter blade terminal receiving slot between the first, second and third jaws. Means are connected to the base for connecting a first external electrical conductor to the base. Means are also carried with the base for electrically connecting a second external electrical conductor to the potential jaw contact.

The second electrical conductor connecting means preferably comprises a flange extending from the base and a fastener mountable on the flange for connecting the second external electrical conductor to the flange.

Means are also provided for connecting a third electrical conductor to at least one potential jaw contact. The third electrical conductor connecting means includes a tab extending from the flange, the tab sized to receive a connector attached to the third electrical conductor.

Means are provided for supporting the line and load jaw contacts and the potential jaw contacts in the housing. The supporting means includes a plurality of dividers carried on the second plate, a boss carried on the second plate and supporting a flange, and an aperture in the boss receiving the fastener engagable to the flange. Slot means are spaced from the boss for receiving the base of one potential jaw contact.

The terminals each include a collar having a through bore and an aperture intersecting the through bore, and a terminal clip having a first and second ends, the first end disposed in the through bore in the collar. The terminal clip is formed by a first pair of tabs formed on the second end of the terminal clip, the pair of tabs defining an aperture adapted to receive one electrical conductor, and a second pair of tabs formed on the terminal clip intermediate the first and second ends of the terminal clip.

A plurality of spaced dividers are formed on the first plate. A pair of flanges are formed on two adjacent dividers and respectively receive a first and second pair of tabs in the terminal collar.

A plurality of posts are carried on the second plate, each support post engaging one terminal clip between the second pair of tabs for supporting the terminal clip in a stationary position. Guide means are formed on the second plate for guiding external electrical conductors into the terminal collar. The guide means are spaced from the support posts with each support post limiting the length of insertion of an external electrical conductor into each terminal collar.

In an alternate embodiment, a plurality of hollow conductive sleeves are mounted in the first plate. An aperture in the first plate is alignable with one end of the conductive sleeve. The second end of the conductive sleeve is electrically coupled to one terminal clip. A bypass plug includes a body having a plurality of pins electrically connected in spaced pairs extending therefrom. The pins are insertable through the apertures in the first plate into electrical engagement with the conductive sleeves and the terminal clips.

The present invention provides a unique watthour meter mounting apparatus containing a safety shield which completely surrounds all exposed portions of the jaw contacts mounted in a watthour socket, socket adapter or related device.

The unique conductor, jaw contact and terminal design of the present invention provides significant advantages over previously devised conductor, jaw contacts and terminals employed in watthour meter socket adapters. The unique potential jaw contacts provide easy connection of one or more external conductors to each potential jaw contact. Further, the conductor connections to the potential jaw contacts and the receptacles surrounding the potential jaw contacts provide easy mounting of the external conductors through the socket adapter housing.

The unique terminal design of the present invention utilizes a terminal clip on the bare end of each conductor extending to a jaw contact. The terminal clip engages the terminal collar and prevents fraying or breakage of the strands of the conductor previously caused by repeated connections to the terminals.

Further, the terminal clip is formed with spaced pairs or tabs which provide easy mounting of each terminal clip in the housing and prevent substantial movement of each terminal clip in its mounted position.

Finally, the terminal collar is designed with a lower end portion which cooperates with the wire guide in the housing to block any openings through the terminals to prevent access of insects into the interior of the socket adapter housing.

BRIEF DESCRIPTION OF THE DRAWING

The various features, advantages and other uses of the present invention will become more apparent by referring to the following detailed description and drawing in which:

FIG. 1 is a perspective view of a prior art potential terminal block;

FIG. 2 is a partially cross-sectioned, side view of a prior art terminal mounted in the terminal block shown in FIG. 1;

FIG. 14 is a partially exploded, perspective view of an alternate embodiment of the watthour meter socket adapter of the present invention used with a plug-in current transformer shorting plug;

FIG. 16 is a partial perspective view of the watthour meter socket adapter of the present invention shown in an assembled form.

DESCRIPTION OF THE PREFERRED EMBODIMENTS

Figure 3:
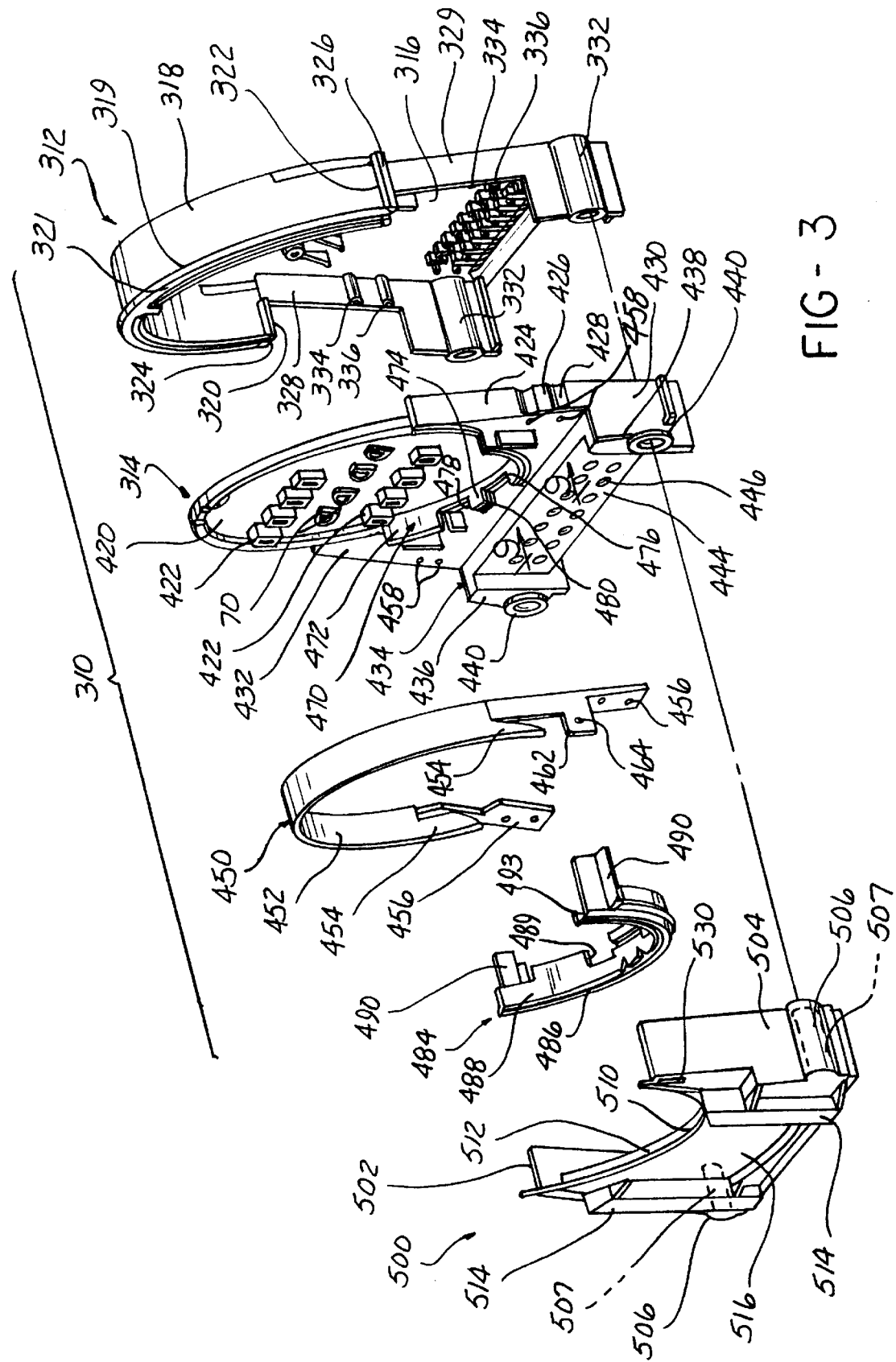
FIG. 3 is an exploded, perspective view of one embodiment of a watthour meter socket adapter constructed in accordance with the teachings of the present invention.

Referring now to the drawing, there is depicted an electrical watthour meter mounting apparatus, such as a socket adapter, having several unique features not previously provided in watthour meter socket adapters.

Figure 4:
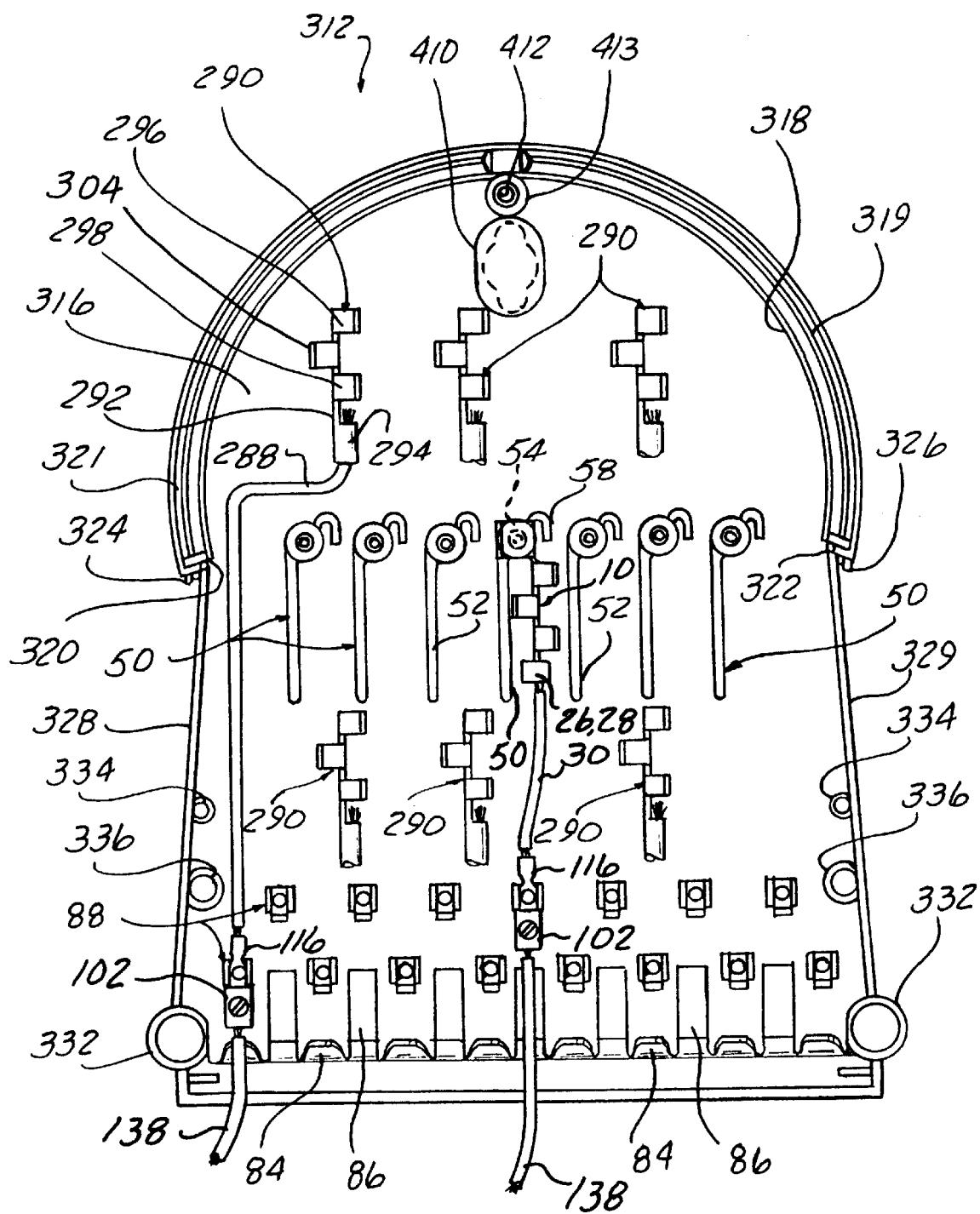
FIG. 4 is a front elevational view of the rear housing portion of the watthour meter socket adapter shown in FIG. 3.

A preferred embodiment of the present invention is shown in FIGS. 3 and 4. In this embodiment, reference number 310 depicts a polyphase A to S-type current transformer or CT rated watthour meter socket adapter. However, it will be understood that the present invention is usable with any type of socket adapter, regardless if it is CT rated or not.

The socket adapter 310 is formed of a two-part housing including a rear housing portion 312 and a front housing portion 314. The rear housing portion 312 is formed with a planar base 316. An annular side wall 318 is integrally formed with and extends substantially perpendicularly from the base 316. The annular side wall 318 terminates in an angular discontinuity formed by side ends 320 and 322. Flanges 324 and 326 extend outward from the side ends 320 and 322, respectively, and are spaced therefrom to form mounting grooves for the rim filler described hereafter.

An annular rim 319 is formed at one edge of the annular side wall 318. An annular recess 321 may optionally be formed in the rim 319 for receiving a ground surge wire. Lower side walls 328 and 329 depend angularly from the side ends 320 and 322 of the side wall 318 to a bottom edge of the rear housing 312. A pair of hollow cylindrical members 332 are mounted integral with the lower side walls 328 and 329 to aid in aligning the front housing portion 314 to the rear housing portion 312.

In addition, a pair of spaced generally cylindrical members 334 and 336 of differing diameters are formed on the side of each of the lower side walls 328 and 329 and form alignment, support and interlock surfaces for the front housing portion 314 as described hereafter.

A metal hanger 410 is mounted on a rear surface of the base 316 for mounting the socket adapter 310 to a support surface in a conventional manner. A threaded boss 412 is formed on the base 316 for receiving a fastener to attach the hanger 410 through an aperture 413 formed in the base 316 of the rear housing 312 as described hereafter.

A plurality of current contacts 290 are arranged in the adapter 310 in the conventional watthour meter adapter line and load contact positions. As shown in FIG. 4 for a three phase application, the top most row of contacts 290 are in contact positions 1, 9 and 3, starting from the left as shown in FIG. 4. The second or lower row of contacts 290 are mounted in positions 2, 10, and 4, again starting from the left edge. The current contacts 290 are positioned to receive individual blade terminals of a three phase current transformer rated watthour meter when such a watthour meter, not shown, is plugged into the socket adapter 310.

Any type of current contact may be employed in the present socket adapter 310, including the current contact shown in FIGS. 30, 31, and 39 of U.S. Pat. No. 5,577,933. The subject matter of this referenced application, with respect to the current contacts 290, are incorporated herein by reference.

Each current contact 290 comprises a planar end 292 from which extends a wire crimp collar 294. The collar 294 receives the end of a current lead 288. A plurality of jaws extend from the end portion 292. A first jaw is formed of spaced legs 296 and 298 which have the same angularly bent shape and terminate in end portions, which are disposed at an approximate 15° angle with respect to the main extent of each leg 296 and 298 and which extend outward in a first direction from the plane in which the end portion 292 lays. The legs 296 and 298 are spaced apart and have an intermediate leg or second jaw 304 interposed therebetween. The leg 304 is formed with a curved position extending from the planar end 292 and a planar, angularly disposed outer end portion which extends outward in an opposite direction with respect to the plane of the end portion 292 from the end portions of the legs 296 and 298. The legs 296, 298 and 304 combine to form a jaw contact for receiving an external lead or terminal.

The intermediate leg 304 may be formed to be more flexible than the legs 296 and 298. This is preferably achieved by forming the leg 304 of a smaller width than the width of the legs 296 and 298. In addition, the end portion of the leg 304 is preferably disposed at an approximate 15° angle from the plane of the planar end portion 292. A curved portion extends from an end of the portion at an angle of greater than 15° from the plane of the end portion 292. This provides a low blade terminal insertion force and a higher pull out force.

The juncture between the curved and end portions on the intermediate leg 304 acts as a detent when it engages a center aperture in a blade terminal inserted into the current contact 290. The resiliency of the leg 304 enables the leg 304 to flex or bend sufficiently to receive or allow the withdrawal of the blade terminal, while lockingly retaining the blade terminal therein.

Figure 5:
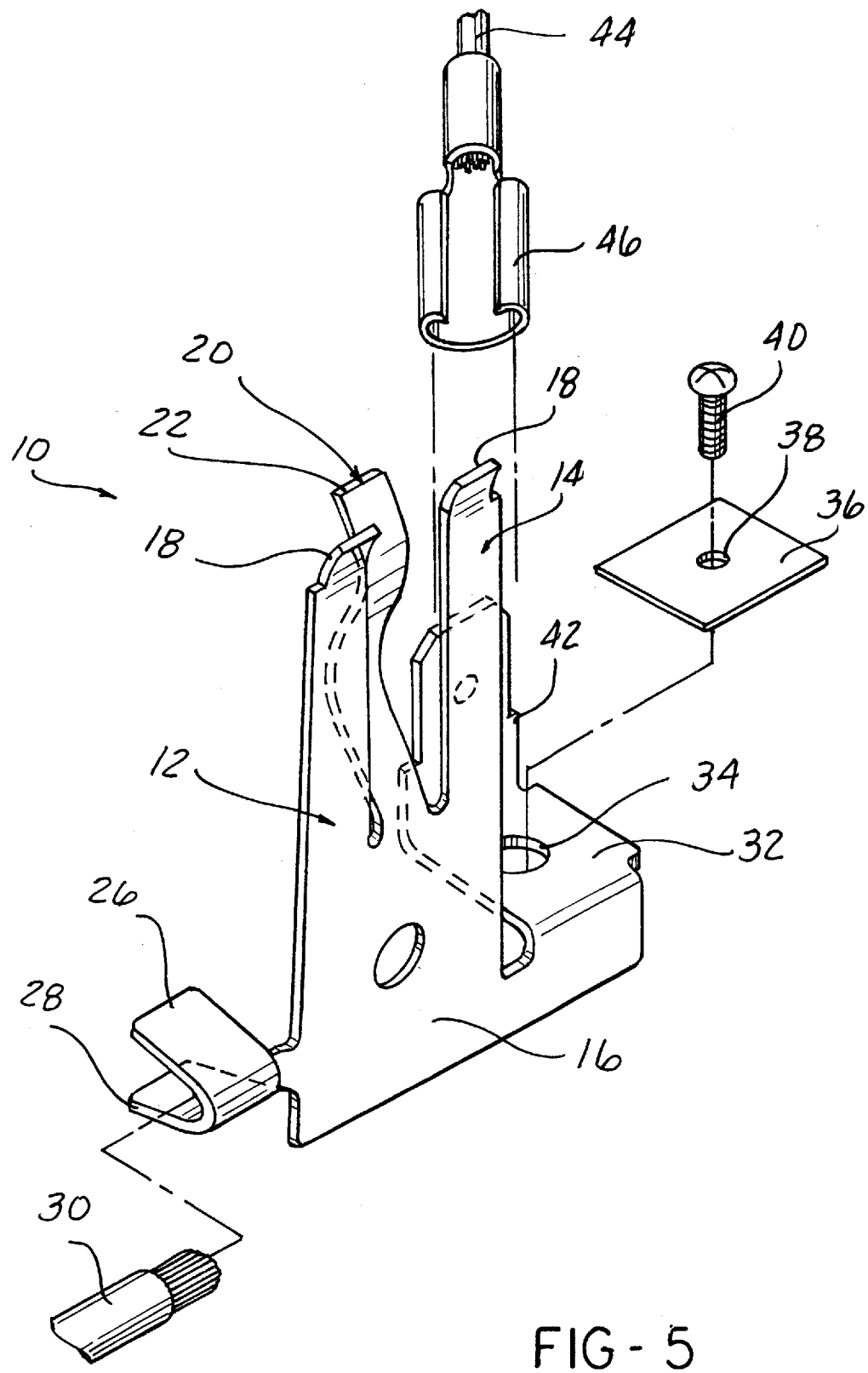
FIG. 5 is an exploded, perspective view of a potential jaw contact constructed in accordance with the teachings of the present invention.
Figure 6:
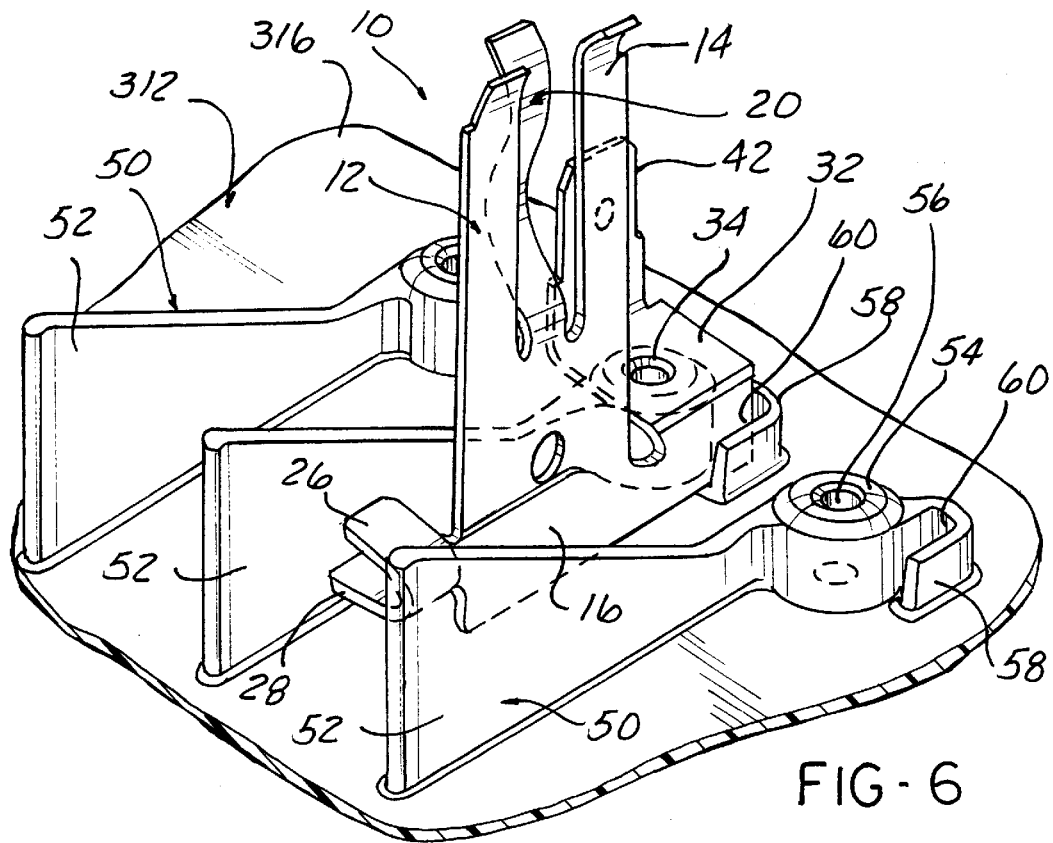
FIG. 6 is a partial, enlarged, perspective view of a potential jaw contact mount for the jaw contact shown in FIG. 5.
Figure 7:
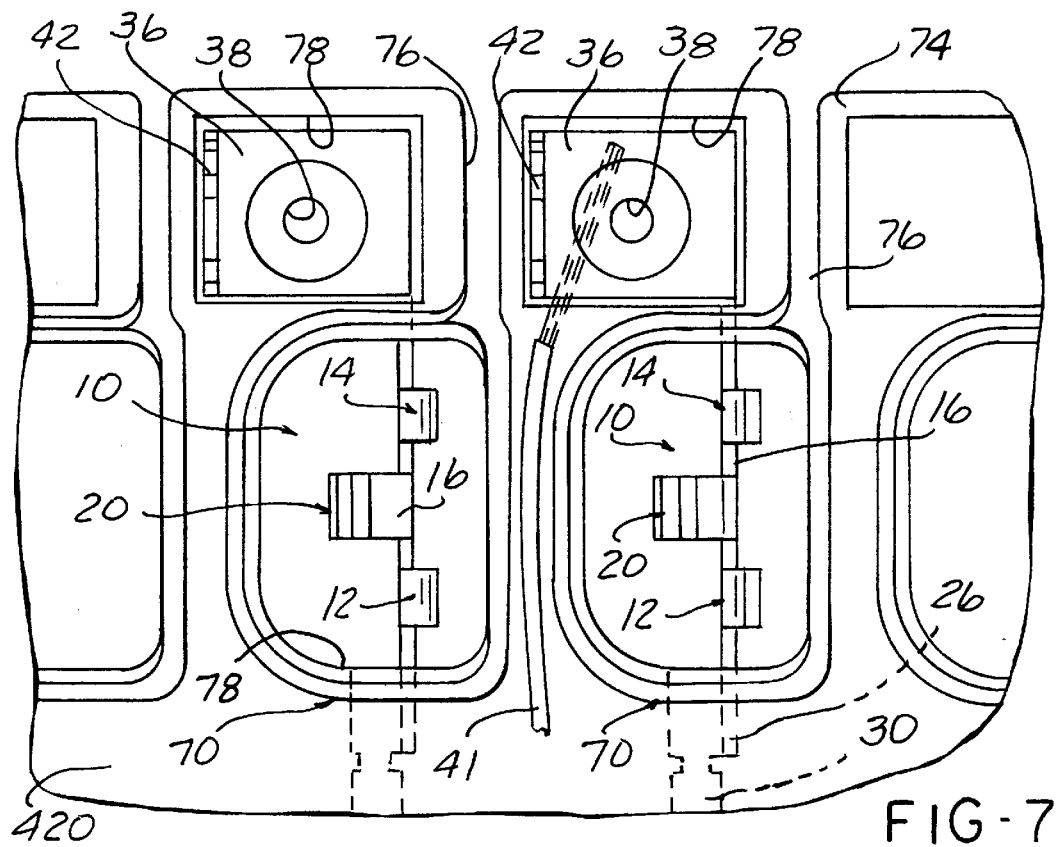
FIG. 7 is a partial, enlarged, front elevational view of potential terminal receptacles on the front housing portion of the watthour meter socket adapter shown in FIG. 3.

A plurality of potential jaw contacts, each denoted by reference number 10 as shown in FIGS. 5–7, are disposed in the socket adapter 10 and held in position between the front and rear housing portions 312 and 314 as described hereafter. As each of the potential jaw contacts 10 is identically constructed, only one potential jaw contact 10 will be described hereafter.

As shown in FIGS. 5 and 6, the potential jaw contact 10 is similar to the current contact 290 described above in that it includes a three finger jaw contact design formed of first and second outer legs 12 and 14 which have a generally linear extent from a base 16. Each of the legs 12 and 14 terminates in an angularly bent or extending end portion 18, both of which extend in the same direction to one side of the base 16. An intermediate leg 20 is disposed between the outer legs 12 and 14 and has a generally sinusoidal shape extending from the base 16 to an opposite side of the base 16 from the outer ends 18 of the outer legs 12 and 14. The outer end 22 of the intermediate leg 20 curves outward to one side of the base 16 opposite from the direction of the outward extent of ends 18 of the legs 12 and 14 to form a jaw contact which receives a potential blade terminal extending outward from the base of a watthour meter, not shown.

A wire crimp collar is formed of two angularly disposed, bendable flanges 26 and 28 extending from one end of the base 16. The flanges 26 and 28 are bendable in registry with one end of an external conductor 30 as shown in FIG. 5 to electrically connect one end of conductor 30 to the potential jaw contact 10. Alternately, solder may be used to connect the conductor 30 to the flanges 26 and 28.

As shown in FIG. 5 and 6, a support flange 32 is formed contiguous with the base 16 and is bent angularly from the base 16 and extends generally perpendicularly from one end of the base 16. A threaded aperture 34 is formed in the support flange 32. A screw fastener 40, with or without a washer 36 threadingly engages the aperture 34 on the support tab 32. An external conductor 41, shown in FIG. 7, can be fixedly disposed between the fastener 40 and the support flange 32 to thereby connect the external conductor 41 to the potential jaw contact 10.

A mounting post or tab 42 extends perpendicularly from an outer end of the support flange 32. The mounting post 42 provides a separate connection to another external electrical conductor shown by reference number 44. In this connection, an electrical connector 46, such as a conventional fast-on or quick connector, is fixedly attached to one end of the external conductor 44 and is slidably engagable over complementary formed mounting post 42 to connect the external conductor 44 to the potential jaw contact 10.

Referring briefly to FIG. 7, it can be seen that sufficient space exists between the aperture 38 in the contact plate 36 which receives the screw fastener 40 and the mounting post 42 to enable the external conductor 41 to be inserted between the screw 40 and the aperture 38 and the mounting post 42 and connected to the potential jaw contact 10.

It will be understood that a support flange 32 and screw fastener 40 and/or the mounting post 42 may also be formed on the current contacts 290 to enable an external conductor to also be connected to any of the current contacts 290.

A plurality of mounts 50, shown in FIGS. 4 and 6, are provided on the rear housing 312 for supporting each potential jaw contact 10 in the rear housing 312 to eliminate the need for separate screw-type fasteners for each contact as in previously devised in watthour meter socket adapters.

Each mount 50 is identically constructed and includes an elongated divider 52 having a generally planar shape Each divider 52 extends from a cylindrical boss 54 having a central bore 56 therein. Bore 56 is designed to receive the end of the screw fastener 40 extending through the contact plate 38 and support flange 32. A generally U-shaped, arcuate tab 58 extends from the cylindrical boss 54. The tab 58 forms an open ended slot 60 next to the boss 54 which has a width designed to releasably but snugly receive one end of the base 16 of one potential jaw contact 10 as shown in FIG. 6. When the end of the base 16 of one potential jaw contact 10 is mounted in the slot 60, the support flange 32 on the contact 10 will overlie and rest on the upper end of the cylindrical boss 54, with the aperture 34 in the tab 32 aligned with the bore 56 in the cylindrical boss 54. The base 16 extends along and is spaced from the divider 52 to provide ample room between spaced dividers 52 for insertion of external conductors into the flanges 26 and 28 at one end of the base 16. It should be noted that this potential jaw contact mount 50 securely mounts the potential jaw contact 10 on the base 316 of the rear housing 312 without the need for any separate fasteners, thereby significantly reducing labor and assembly time of the watthour meter socket adapter.

As shown in FIG. 3, the front housing portion 314 is formed as a one-piece, integrally molded member of an electrically insulating material, such as a suitable plastic. The front housing portion 314 can be formed of a transparent plastic to enable the location and connections of the conductors disposed behind the front housing portion 314 to be easily viewed. The front housing portion 314 includes a generally circular shaped, planar base 420. A plurality of hollow pockets or receptacles 422 are integrally formed on and extend outward from one surface of the base 420. Each receptacle 422 is designed to mount a jaw contact attached to an electrical conductor and includes a slot for slidably receiving a blade terminal of a watthour meter or other electrical apparatus inserted into the adapter 310. Further details concerning the construction, shape and use of the receptacles 422 can be had by referring to co-pending patent application Ser. No. 08/521,009, now U.S. Pat. No. 5,577,933 issued Nov. 26, 1996, the contents of which pertaining to the receptacles 422 are incorporated herein.

A pair of spaced mounting flanges 424, only one of which is shown in FIG. 3, extend from the base 420 of the front housing portion 314 and are engagable with the flanges 324 and 326 formed at the ends 320 and 322, respectively, of the side wall 318 of the rear housing portion 312. In this position, the mounting flanges 424 overlay a portion of the lower side walls 328 and 325 of the rear housing portion 312. A pair of arcuate, generally cylindrical recesses 426 and 428 are formed in each mounting flange 424 and are sized to matingly surround the cylindrical members 334 and 336 on the rear housing portion 312 to fixedly support and locate the front housing portion 314 to the rear housing portion 312 in a round dovetail like joint. A lower side wall 430 extends from the lowermost arcuate member 428 on each side of the first housing portion 314 to a bottom edge of the front housing portion 314.

A front cover filler 432 extends below the base 420 of the front housing portion 314 to a terminal block portion 434. The terminal block portion 434 extends outward from the front cover filler 432 and terminates in a pair of raised side walls 436 and 438 on opposite sides of the lower portion of the front cover filler 432. A pair of annular support members 440 are mounted in the side walls 436 and 438 and are alignable with the cylindrical bosses 332 in the rear housing portion 312 so as to receive mating and location pins 507 on terminal cover 500 as described hereafter.

A surge ground conductor 450 is mountable over the base 420 of the front housing portion 314 and is disposed within the annular side wall 318 of the rear housing portion 312 after the front housing portion 314 has been joined to the rear housing portion 312. The surge ground conductor 450 includes an annular ring 452 which terminates at opposed ends in a pair of tapered fingers 454. Also, a pair of depending mounting flanges 456 extend from a rear edge of the annular ring 452 and include apertures which are alignable with corresponding apertures on the front cover filler 432 for receiving fasteners to attach the surge ground conductor 450 to the front housing portion 314. One fastener extends through the uppermost aperture on each mounting flange 456 and one of the apertures 458 into the cylindrical member 334 in the rear housing portion 312 to secure the front and rear housing portions 314 and 312 together. Another fastener is extendable through each lower aperture in each mounting flange 456 and an aperture 458 in the front housing portion 314 and through the cylindrical member 336 to mount the socket adapter 310 to a wall or other support surface.

In addition, although not shown in FIG. 3, a depending aperture flange is centrally formed at an upper portion of the annular ring 452 and is alignable the threaded boss 412 in the top upper portion of the base 420 of the front housing portion 314.

As also shown in FIG. 3, an outwardly extending flange 462 is formed on one depending flanges 456 of the surge ground conductor 450 and includes an aperture 464.

A rim filler denoted generally by reference number 470 is formed on the base 420 of the front housing portion 314 and is positioned to fill the angular discontinuity between the side edges 320 and 322 of the annular side wall 318 of the rear housing portion 312 when the front housing portion 314 is mounted in the rear housing portion 312. The rim filler 470 extends substantially perpendicularly from a lower portion of the base 420 and includes a plurality of angularly spaced tabs 472, 474, and 476 which are angularly spaced apart to form open ended slots all denoted by reference number 478 therebetween.

Pointed tabs 480 are formed on the rim filler tabs 472, 474, and 476 to mate with corresponding slots formed on a rim filler extension 484. As shown in FIG. 3, the rim filler extension 484 includes an arcuate portion 486 sized to fill the annular discontinuity in the annular side wall 318 of the rear housing portion 312. A plurality of inward extending, spaced tabs 488 are formed in the arcuate portion 486 and are spaced apart to form open ended slots 489 therebetween which align with the slots 478 in the rim filler 470 when the rim filler extension 484 is mounted on the rim filler 470 by means of the interlocking tabs and slots. A pair of mounting arms 490 extend outward from opposite ends of the arcuate portion 486 and interlock with the flanges 324 and 326 of the rear housing portion 312 to align the rim filler extension 484 with the rear housing portion 312.

The outer ends of the arcuate portion 486 are formed with a narrow projection which extends outward from each outer end. Each projection slidably engage a mating slot formed in each side end 320 and 322 of the annular side wall 318 of the rear housing portion 312. In addition, a ledge on each end of the rim filler extension 484 engages a similar ledge 499 on each side end 320 and 322 of the annular side wall 318 to limit insertion of the rim filler extension 484 into the annular side wall 318.

The slots 478 and 489 formed between the rim filler 470 and the rim filler extension 484 are disposed adjacent to the base 420 of the front housing portion 314 and provide openings through which auxiliary wires connected to electronic circuits in a watthour meter mounted in the socket adapter 310 or from current terminals or other terminals mounted in the socket adapter 310 to pass from the front housing portion 314 to the terminal portion, and from the terminal portion, as described hereafter, externally from the adapter 310.

The rim filler extension 484 includes a peripheral flange extending radially outward from the annular portion 486. The flange has a recessed shoulder formed at an outer peripheral edge thereof. When the rim filler extension 484 is attached to the rim filler 470, the peripheral flange on the rim filler extension 484 is spaced from the front cover filler 432 to form an opening therebetween for passage of the auxiliary wires extending from the front housing portion 314 through the openings formed between the slots 478 and 490 in the rim filler 470 and the rim filler extension 484.

A terminal portion 444 is formed on the terminal block 434. The terminal portion 444 includes a planar plate extending between side walls 436 and 438. A plurality of apertures 446 are formed in the terminal portion 444 and open to the back surface of the terminal portion 444.

A terminal cover denoted generally by reference number 500 in FIGS. 3 is mountable over the terminal portion 444 of the front housing portion 314. The terminal cover 500 includes a front wall 516 and a pair of side walls 502 and 504. The side walls 502 and 504 slide over the lower side walls 328 and 329 of the rear housing portion 312. A cylindrical boss 506 is formed in each side wall 502 and 504 for surrounding alignment with one of the tubular members 332 formed in the side walls 328 and 329 of the rear housing portion 312. A pin 507 is mounted internally and concentrically within each boss 506. The pins 507 are typically hollow tubular members which taper toward the rear edge of the terminal cover 500. The pins 507 extend through the annular support members 440 and the cylindrical members 332 when the terminal cover 500 is mounted on the front housing portion 314 and are perpendicular to the surface of the front housing portion 314 to restrict partial removal of the terminal cover 500 from the front housing portion 314.

An arcuate edge 510 formed on the front wall 516 extends between the side walls 502 and 504 and has an inward extending flange 512 extending therefrom. The edge 510 engages a shoulder in the rim filler extension 484.

A pair of raised channel sections 514 are integrally formed on the terminal cover 500 and extend outward from the front wall 516 of the terminal cover 500. Channel portions 514 are hollow and form an interior cavity 517 which opens to a cavity between the front wall 516 and the front cover filler 432 for the passage of the auxiliary wires through the terminal cover 500 in front of the terminals mounted behind the front housing portion 314. Ribs may optionally be mounted on the front wall 516 of the terminal cover 500 and extend angularly from one end of each channel portion 514. The channel portions 514 and/or the optional ribs function as stops to limit the amount of angular movement of a barrel lock mounted on a sealing ring used to lockingly mount a watthour meter in the socket adapter 310.

In addition, a slot 530 is formed along one edge of the terminal cover 500 adjacent to the side wall 504 and is alignable with the outwardly extending flange 462 on the surge ground conductor 450.

As shown in FIG. 16, a sealing ring 540 is mounted on a mounting flange on the rim 319 and a mating mounting flange of a watthour meter, not shown. The sealing ring 540 is of conventional construction and includes spaced ends which are brought into engagement when the sealing ring 540 is mounted on the mating mounting flanges. A flange 542 extending outward from one end of the sealing ring 540 passes through a slot in the other end of the sealing ring 540. At least one aperture is formed in the flange 542. Due to the close proximity of the flange 462 on the surge ground conductor 450 with the rim filler extension 484, a conventional seal 546, such as a lead wire seal, may be used to sealingly connect the flange 462 and the flange 542 on the sealing ring 540 to provide an indication of any tampering or unauthorized removal of the sealing ring 540 from the adapter. A wire 548 is passed through the aperture 464 in the flange 462 on the surge ground conductor 450 and the aperture in the flange 542 on the sealing ring 540 before the ends of the wire 548 are lockingly crimped into the lead slug 550.

This arrangement enables a single seal to be used with both the sealing ring 540 and the terminal cover 500 and eliminates the need for two separate seals, one for the sealing ring and one for the terminal cover.

When the front and rear housing portions 314 and 312 are joined together, the base 420 of the front housing portion 314, the base 316 of the rear housing portion 312, and the hollow receptacles 422 formed on the base 420 of the front housing portion 314 cooperate to form a safety shield which substantially, except for the slots in the receptacles 422, surrounds and encloses the conductors, the jaw contacts and the terminals in the adapter 310.

As shown in FIG. 3, and in greater detail in FIG. 7, a plurality of receptacles or pockets, each denoted by reference number 70, are also formed on the base 420 of the front housing portion 314. Each receptacle 70 is configured for encompassing one potential jaw contact 10. Preferably, each receptacle 70 is integrally formed as a part of the base 420 and extends outward from the base 420. An aperture 72 is formed in each receptacle 70 and extends through the interior of the receptacle 70 and through the base 420. This enables the potential jaw contact 10 to extend into the interior of a receptacle 70 when the front and rear housing portions 312 and 314 are joined together. The upper edge of each receptacle 70 extends outward further than the upper end of the legs of each potential jaw contact 10 to provide a shield which prevents inadvertent contact with the potential jaw contacts 10.

A base wall 74 extends upward from the base 420 of the front housing portion 314. A plurality of short walls 76 extend from the base wall 74 and are spaced apart. Each short wall 76 extends to and forms a continuous part of one receptacle 70. A plurality of apertures 78 are formed in the base 420 between adjacent, spaced short walls 76. Each aperture 78 provides access to the contact plate 38 and the mounting post 42 for the attachment of external conductors to any of the potential jaw contacts 10, such as external conductor 41 shown in FIG. 7. Such external conductors, such as conductor 41, can be routed through the openings in the rim filler 470 and through the raised channels within the terminal portion 434.

Figure 8:
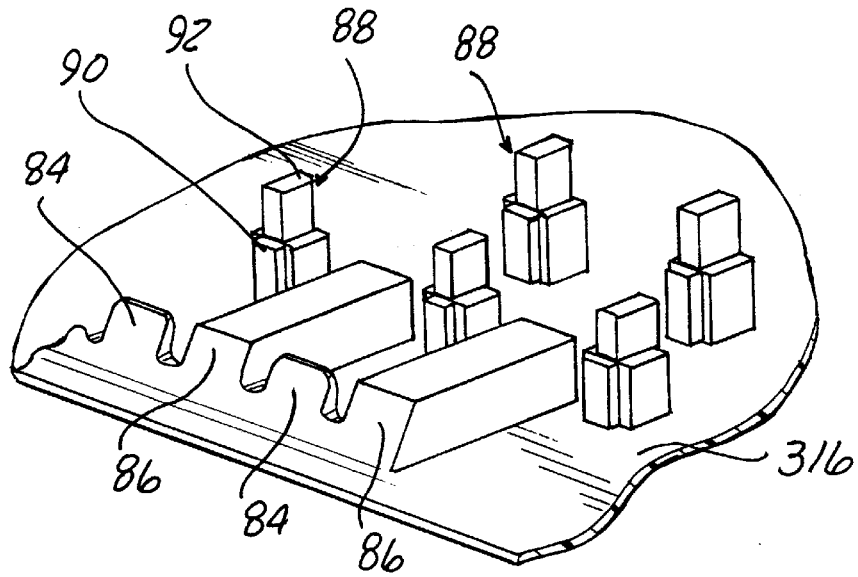
FIG. 8 is a partial, enlarged, perspective view of the terminal portion of the rear housing portion of the watthour meter socket adapter shown in FIG. 3.

As shown generally in FIG. 3, and in greater detail in FIGS. 4 and 8, a plurality of linearly arranged, spaced wire guides, arranged in alternating sets 84 and 86, are integrally formed as a part of the base 316 of the rear housing portion 312. The wire guides 84 and 86 have two different shapes. The wire guides 84 are each in the form of a tab extending angularly from the plane of the base 316. Interposed between each pair of wire guides 84 is one wire guide 86 which is in the form of an elongated block having an end face extending angularly from the plane of the base 316.

Figure 13:
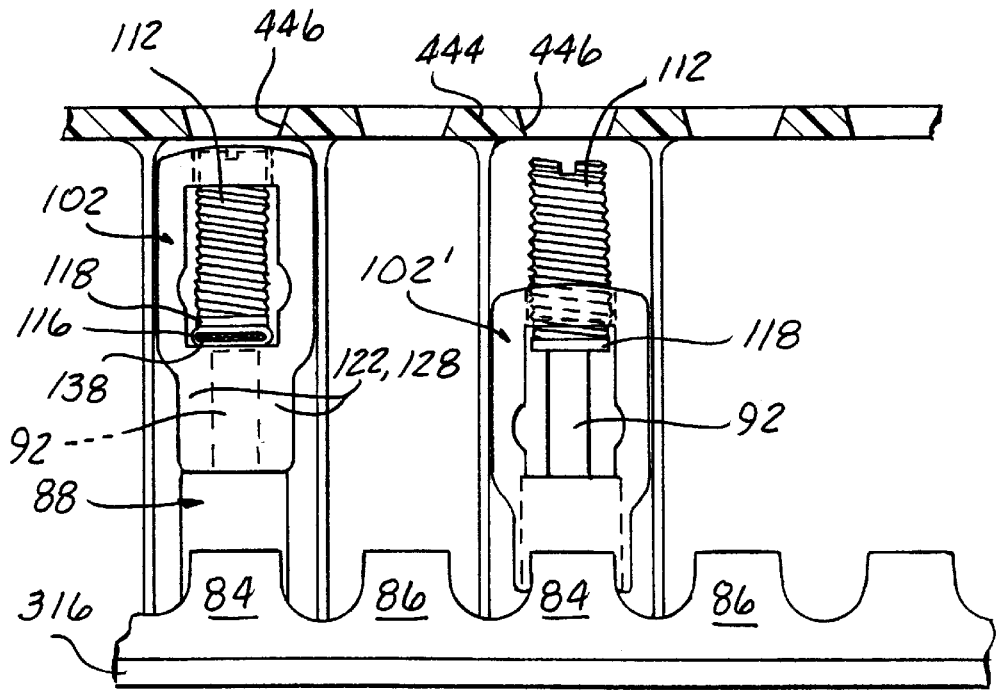
FIG. 13 is a partial end view of the assembled watthour meter socket adapter shown in FIG. 3.

A plurality of support posts 88 are arranged in alternating rows as shown in FIGS. 4 and 8. Each support post 88 has a generally cubicle base 90 and a smaller upper end 92. One support post 88 is spaced from one wire guide 84 or 86 and acts as a stop to limit the length of insertion of an external conductor into the bottom end portion of the socket adapter 310. Further, the angled end faces of the wire guides 84 and 86 automatically guide an external conductor into the opening formed above each wire guide 84 and 86 as shown in FIG. 13.

Figure 11:
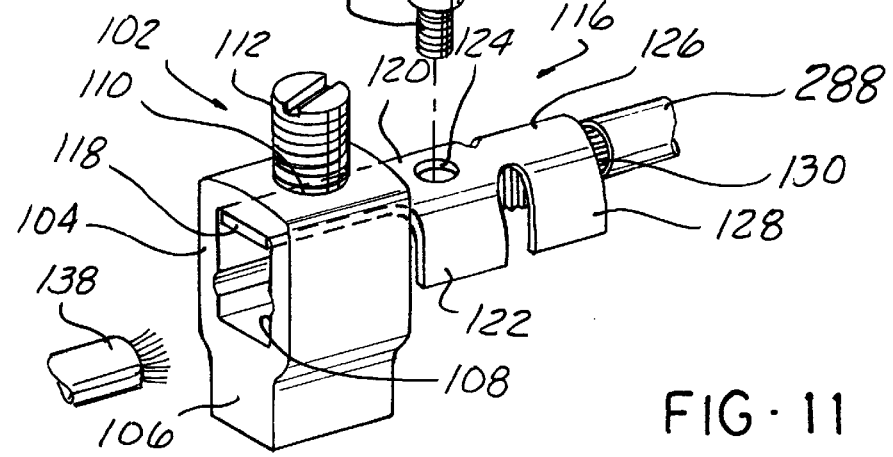
FIG. 11 is a perspective view of the terminal collar and the terminal clip shown in FIG. 11 depicted in an open, conductor receiving position.
Figure 12:
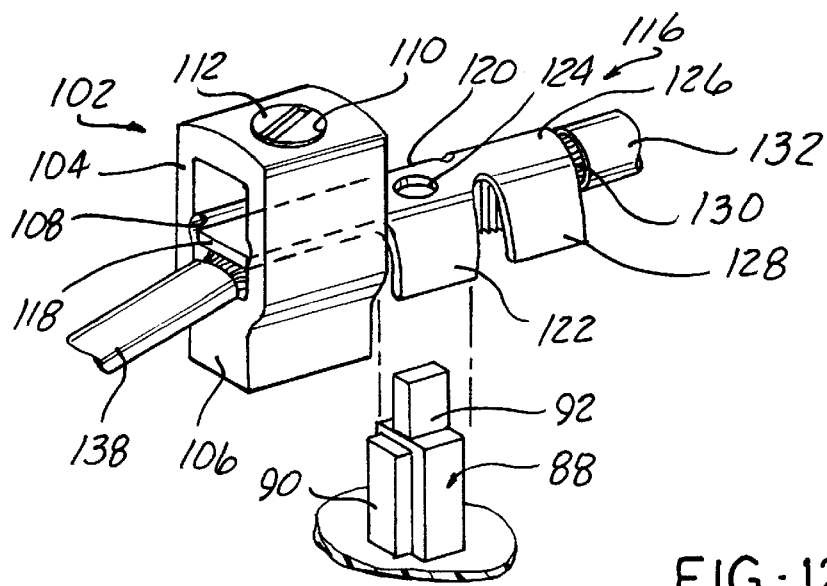
FIG. 12 is a partially exploded, perspective view of the terminal collar and the terminal clip of FIG. 11 depicted in an external conductor inserted position.

A plurality of terminals are mounted in the terminal portion of the front and rear housings 312 and 314. Each terminal is identically constructed and includes a terminal collar 102 having an enlarged upper end 104 and a smaller width lower end 106. A through bore 108 extends through the upper end 104. A threaded aperture 110 is also formed in the upper end 104 and intersects the through bore 108. The threaded aperture 110 threadingly receives a screw fastener 112 as shown in FIGS. 11, 12 and 13. As shown in FIG. 13, each screw 112 is non-removably positioned in line with the aperture 446.

Each terminal collar 102 is slidably disposed between one support post 88 and one adjacent wire guide 84 or 86.

Figure 10:
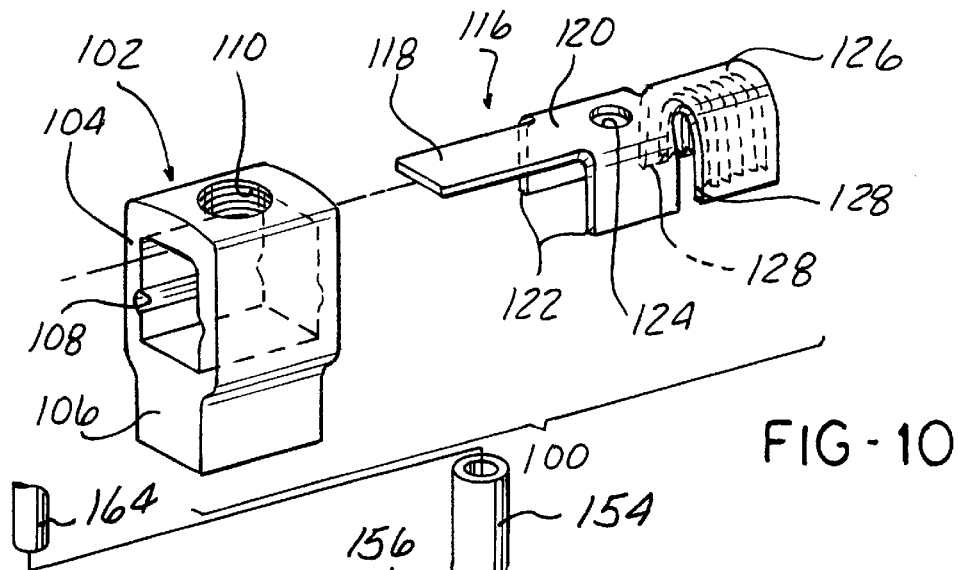
FIG. 10 is an exploded, perspective view of a terminal collar and a terminal clip constructed in accordance with the teachings of the present invention.

A unique terminal clip 116 shown in FIGS. 10–12 is used with the terminal collar 102 to form the complete terminal 100. The terminal clip 116 has a planar or slightly curved first end 118 which is sized for slidable insertion into the bore 108 in the terminal collar 102. The first end 118 is engaged by the screw fastener 112 as described hereafter. An intermediate portion 120 extends linearly from the first end 118. At least one and preferably an intermediate pair of tabs 122 extend generally perpendicularly from the intermediate portion 120. The purpose of the tabs 122 will also be described hereafter. An aperture 124 is optionally formed in the intermediate portion 120 between the tabs 122.

A second end portion 126 extends linearly from the intermediate portion 120 and has a pair of second tabs 128 extending therefrom which form a connector means for receiving an electrical conductor. The second tabs 128 are designed to be crimped into engagement with the bare end 130 of one of the conductors 288 extending from one of the current contacts 290 or one conductor 30, not shown in FIG. 11, extending from one of the potential contacts 10. Solder may also be used to fixedly join the bare end 130 of the conductor 132 to the tabs 128.

Figure 15:
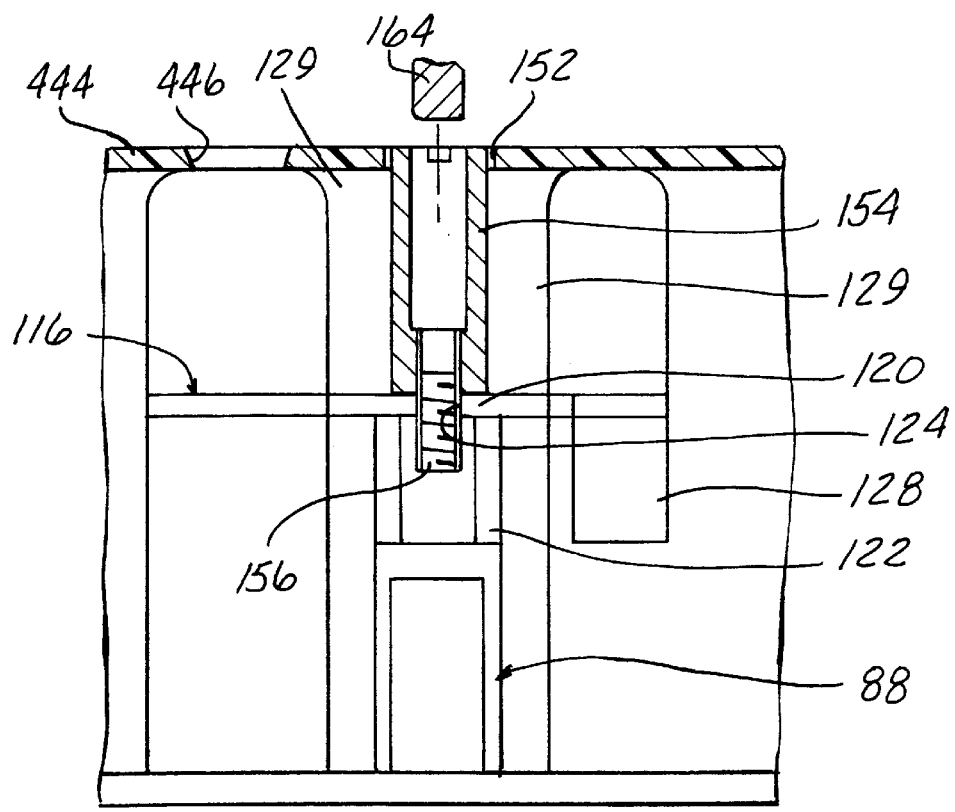
FIG. 15 is a cross-sectional view through the terminal portion and the current transformer shorting plug of FIG. 14 shown in their assembled position.

The intermediate tabs 122 are spaced apart a distance sufficient to slide over the upper end 92 of a support post 88 and seat on the shoulder between end 92 and base 90 to support each terminal clip 116 on the base 316. As shown in FIG. 15, at least one and preferably a pair of ribs 129 extend from the cover 444 and engage the terminal clip 116 to retain the clip 116 in place in conjunction with the support post 88.

Figure 9:
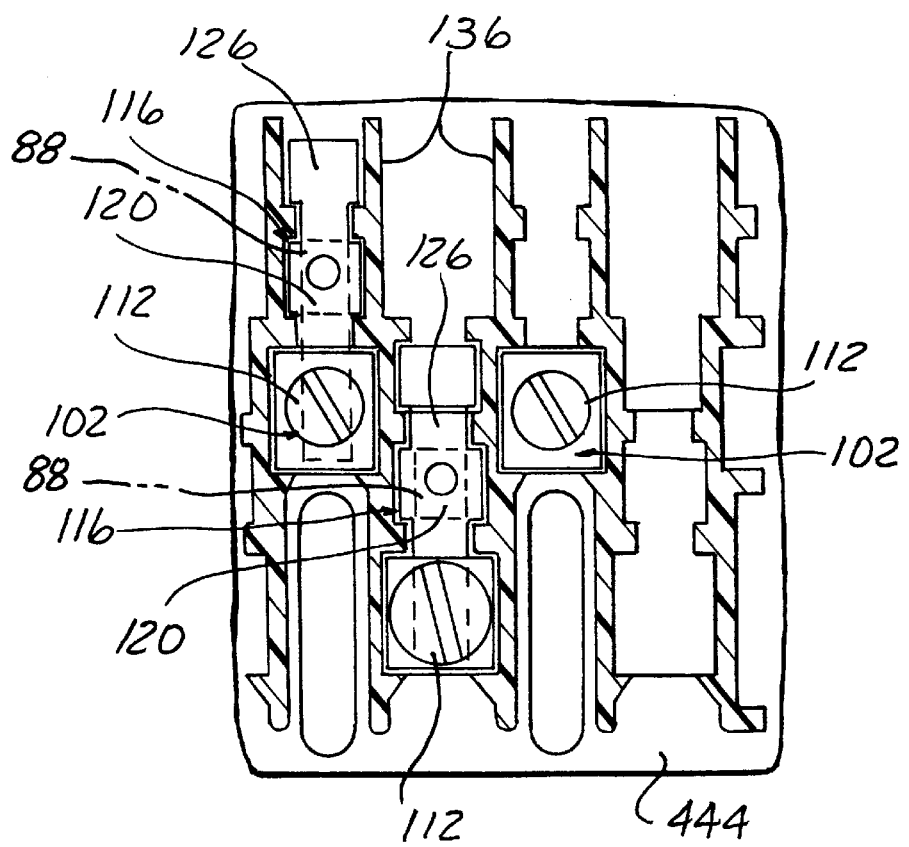
FIG. 9 is a cross-sectional view of the terminal portion of the front housing portion of the watthour meter socket adapter shown in FIG. 3.

FIG. 9 depicts a cross-sectional view through the terminal portion 444 of the front housing 314. As shown therein, a plurality of spaced dividers denoted generally by reference numbers 136 are integrally formed on and extend from the cover of the terminal portion 444. Each divider 136 has a plurality of outwardly extending flanges which, in conjunction with the flanges on adjacent dividers 136 form pairs of flanges which are sized and positioned to form channels which slidably receive selected portions of the terminal collar 102 and the terminal clip 116 to slidably retain the terminal collar 102 and the terminal clip 116 in position between the mating terminal portions of the front and rear housings 312 and 314 as shown in FIG. 9.

Further, as described above and shown in FIGS. 11 and 12, the terminal clip 116 is fixedly positioned on one of the support posts 88. However, the terminal collar 102 is slidably disposed in a channel between a pair of spaced dividers 136 and is capable of movement relative to the base 316 of the rear housing 312 in response to threading movement of the screw fastener 112 as described hereafter.

As shown in FIG. 11, with the screw fastener 112 fully retracted out of the bore 110, the terminal collar 102 will be forced downward toward the base 316 of the rear housing portion 312 since the screw 112 abuts the cover 444. This causes the first end portion 118 of the terminal clip 116 to be disposed in the upper portion of the bore 108 and forms an opening in the lower portion of the bore 108 for receiving an external conductor 138. With one end of an external conductor 138 disposed in the bore 108, the screw fastener 112 is threaded into the terminal collar 102. However, since the terminal clip 116 is held in position, such threading engagement of the screw 102 with the threaded aperture 110 in the terminal collar 102 causes the terminal collar 102 itself to move upward relative to the rear housing portion 312 until the first end portion 118 of the terminal clip 116 securely engages the end of the conductor 138 to firmly secure the conductor 138 in the terminal 102 in electrical connection with the internal conductor 132.

Another feature of the present invention is shown in FIG. 13 which depicts a bottom end view of the assembled front and rear housings 312 and 314. In this view, it can be seen that with the left-most terminal 102 in a connected position with external conductor 138, the lower portion 106 of the terminal is aligned with the tabs 122 and 128 on the clip 116 to form a barrier preventing the ingress of insects into the interior of the socket adapter 310.

Likewise, the right-most terminal 102 is disposed in a lowered position in the channel between the dividers to form an opening to receive an external conductor. In this position, the top end 92 of the support post 88 extends above the top of the wire guides 84 in the back of the opening formed by the bore 108 in the collar 102 to form an insect barrier.

Another embodiment of the present invention is shown in FIG. 14. In FIG. 14, the socket adapter 310 is constructed in the same manner as described above. However, in this embodiment, the socket adapter 310 includes an additional row of spaced bores 152 in the cover of the terminal portion 444. The bores 152 open to channels formed between the pairs of spaced dividers 136 extending from the rear surface of the cover of the terminal portion 444. The bores 152 are aligned with the apertures 124 in the intermediate portion 120 of a terminal clip 116. A conductive sleeve 154 is mounted in each bore 152 and extends rearward from the cover of the terminal portion 444. A fastener at one end of the conductive sleeve 154 connects the sleeve 154 to the intermediate portion 120 of one terminal clip 116 by threading engagement with the aperture 124 in the terminal clip 116. This arrangement electrically connects one conductive sleeve 154 to one terminal clip 116.

A shorting or bypass plug denoted generally by reference number 158 is provided for releasable insertion into the bores 152. The plug 158 is formed of a body 160 having an aperture slot 162 forming a handle. At least one and preferably a plurality of pins 164 are mounted in and extend outward from one side or end of the plug body 160. The pins 164 are sized for sliding engagement with the conductive sleeves 154 mounted in the terminal portion 444 of the socket adapter 310. Pairs of pins 164 may be electrically connected by conductors extending between each pair of pins and mounted in the body 160 of the plug 158. Insertion of the pins 164 of the plug 158 into the bores 152 enables selective line and load contacts connected by conductors to the terminal clips 116 to be shorted out, thereby enabling a watthour meter to be removed from the socket adapter 310 without damage to the current transformers.

What is claimed is:

1. A watthour meter socket adapter electrically receiving blade terminals of a watthour meter, the socket adapter comprising:
   a housing including a meter receiving portion and a terminal portion;
   a plurality of jaw contacts mounted in the meter receiving portion;
   at least one jaw contact including:
      a base;
      a plurality of jaws extending from the base adapted for receiving a blade terminal of a watt hour meter;
      first discrete means, carried on the base, for connecting a first primary electrical conductor to the base;
      second discrete means, coupled to the base and engagable with a fastener, for electrically connecting a second electrical conductor to the jaw contact;
   third discrete means coupled to the base, for connecting a third electrical conductor to the at least one jaw contact;
   a plurality of terminals in the terminal portion, and
   the first primary electrical conductor connected between the means for connecting the first primary electrical conductor to the at least one jaw contact and one terminal in the terminal portion of the housing.

2. The watthour meter socket adapter of claim 1 wherein the second electrical conductor connecting means comprises:
   a flange extending from the base; and
   a fastener engagable with the flange for connecting the second external electrical conductor to the flange.

3. The watthour meter socket adapter of claim 2 wherein the means for connecting a third electrical conductor comprises:
   a tab extending from the flange, the tab sized to receive a quick connector attached to the third electrical conductor.

4. The watthour meter socket adapter of claim 1 further comprising:
   means, disposed in the housing, for covering substantially all of the electrical conductors and the jaw contacts, the covering means including a plurality of apertures, one aperture disposed adjacent each jaw contact for receiving a blade terminal of a meter therethrough.

5. The watthour meter socket adapter of claim 4 wherein:
   the meter receiving portion is formed of first and second plates and an annular side wall extending between the first and second plates, the first and second plates spaced apart to define a cavity therebetween, the at least one electrical conductor and the jaw contacts disposed in the cavity and substantially enclosed by the first and second plates and the annular side wall.

6. The watthour meter socket adapter of claim 1 further comprising:
   a plurality of potential jaw contacts mounted in the meter receiving portion and adapted to receive potential terminals on a meter;
   each potential jaw contact including:
      a base;
      first and second spaced, substantially co-planar, angularly bent jaws extending from the base;
      a third angularly bent jaw extending from the base and disposed between the first and second jaws, an outer end of the third jaw spaced from outer ends of the first and second jaws to define a meter blade terminal receiving slot between the first, second and third jaws.

7. The watthour meter socket adapter of claim 1 wherein:
   the means for connecting the first primary electrical conductor to the base of each jaw contact is integrally formed with the base.

8. The watthour meter socket adapter of claim 1 wherein:
   the tab extends from the flange.

9. The watthour meter socket adapter of claim 1 wherein each terminal comprises:
   a collar having a through bore and an aperture intersecting the through bore;
   a terminal clip having first and second ends, the first end disposed in the through bore in the collar; and
   a threaded fastener engageable through the aperture in the collar with the first end of the terminal clip to connect an external electrical conductor between the first end of the terminal clip and the terminal collar.

10. A watthour meter socket adapter electrically receiving blade terminals of a watthour meter, the socket adapter comprising:
    a housing including a meter receiving portion, the meter receiving portion being formed of first and second plates and an annular side wall extending between the first and second plates, the first and second plates spaced apart to define a cavity therebetween;
    a terminal portion spaced from the meter receiving portion;
    a first electrical conductor and a second electrical conductor;
    a plurality of jaw contacts mounted in the meter receiving portion;
    at least one jaw contact including:
       a base;
       a plurality of laws extending from the base adapted for receiving a blade terminal of a watthour meter;
       means, carried on the base, for connecting the first electrical conductor to the base; and
       means, carried with the base, for electrically connecting a second electrical conductor to the jaw contact;
    means for supporting the jaw contacts in the housing, the supporting means including:
       a plurality of spaced dividers carried on the second plate; and
    flange means, carried on the second plate spaced from each divider and defining a slot with one divider, for receiving the base of one jaw contact therein; and
    means, disposed in the housing, for covering substantially all of the electrical conductors and the law contacts, the covering means including a plurality of apertures, one aperture disposed adjacent each jaw contact for receiving a blade terminal of a meter therethrough.

11. The watthour meter socket adapter of claim 10 further comprising:
    the second electrical conductor connecting means including:
    a flange extending from the base; and
    a fastener engagable with the flange for connecting the second electrical conductor to the flange;
    the supporting means including:
    a boss carried on the second plate and supporting a flange; and an aperture in the boss receiving the fastener engagable to the flange.

12. A watthour meter socket adapter electrically receiving blade terminals of a watthour meter, the socket adapter comprising:
a housing including a meter receiving portion and a terminal portion;
a plurality of jaw contacts mounted in the meter receiving portion;
at least one jaw contact including:
first and second spaced, substantially co-planar, angularly bent jaws extending from the base;
a third angularly bent jaw extending from the base and disposed between the first and second jaws, an outer end of the third jaw spaced from outer ends of the first and second jaws to define a meter blade terminal receiving slot between the first, second and third jaws;
a base; and
means, carried on the base, for connecting a first primary electrical conductor to the base;
discrete flange means, extending from the base and receiving a fastener, for connecting a second external electrical conductor to the flange means;
a discrete tab coupled to the base, the tab receiving a quick connector attached to a third electrical conductor to attach the third electrical conductor to the at least one jaw contact;
a plurality of terminals mounted in the terminal portion; and
the first primary electrical conductor extending from at least one jaw contact to one terminal.

13. A watthour meter socket adapter electrically receiving blade terminals of a watthour meter, the socket adapter comprising:
a housing including a meter receiving portion;
a terminal portion spaced from the meter receiving portion;
a plurality of jaw contacts mounted in the meter receiving portion;
at least one jaw contact including:
a base; and
means, carried on the base, for connecting a first electrical conductor to the base;
means, carried with the base, for electrically connecting a second electrical conductor to the jaw contact;
a plurality of terminals mounted in the terminal portion, each terminal including:
a collar having a through bore and an aperture intersecting the through bore; and
a terminal clip having first and second ends, the first end disposed in the through bore in the collar; and
a threaded fastener engageable through the aperture in the collar with the first end of the terminal clip to connect an external electrical conductor between the first end of the terminal clip and the terminal collar;
the terminal clip further including:
means, carried on the second end of the terminal clip for connecting one electrical conductor to the terminal clip; and
tab means, formed on the terminal clip intermediate the first and second ends of the terminal clip, for positioning the terminal clip in the housing.

14. A watthour meter socket adapter electrically receiving blade terminals of a watthour meter, the socket adapter comprising:

a housing including a meter receiving portion;
a terminal portion spaced from the meter receiving portion;
a plurality of jaw contacts mounted in the meter receiving portion;
at least one jaw contact including:
a base; and
means, carried on the base, for connecting at least one first electrical conductor to the base;
means, carried with the base, for electrically connecting a second electrical conductor to the jaw contact;
a plurality of terminals mounted in the terminal portion, each terminal including;
a collar having a through bore and an aperture intersecting the through bore; and
a terminal clip having first and second ends, the first end disposed in the through bore in the collar; and
a threaded fastener engagable through the aperture in the collar with the first end of the terminal clip to connect an external electrical conductor between the first end of the terminal clip and the terminal collar;
at least one tab formed on the terminal clip intermediate the first and second ends of the terminal clip;
a plurality of spaced dividers formed on the housing; and
flange means, formed on at least one of the dividers and forming a channel, for receiving the at least one tab on the terminal clip.

15. The watthour meter socket adapter of claim 14 further comprising:
a plurality of support posts carried on the housing, each support post engaging one terminal clip for supporting the terminal clip in a stationary position relative to the housing.

16. The watthour meter socket adapter of claim 14 further comprising:
guide means, formed on the housing, for guiding external electrical conductors into the terminal collar.

17. The watthour meter socket adapter of claim 16 wherein:
the guide means are spaced from the support posts, each support post limiting the length of insertion of an external electrical conductor into each terminal collar.

18. The watthour meter socket adapter of claim 14 further comprising:
a cover disposed over the terminal portion of the housing;
a plurality of apertures formed in the cover, one threaded fastener aligned with one aperture;
channel means, formed in the housing, for slidably receiving one terminal collar; and
the apertures in the cover having a diameter permitting access to the threaded fastener to threadingly rotate the threaded fastener while preventing passage of the threaded fastener through the apertures.

19. The watthour meter socket adapter of claim 9 further comprising:
dividers formed on the housing and disposed between the guide means.

20. A watthour meter socket adapter electrically receiving blade terminals of a watthour meter, the socket adapter comprising:
a housing including a meter receiving portion;
a terminal portion spaced from the meter receiving portion;
a plurality of jaw contacts mounted in the meter receiving portion;

at least one jaw contact including:
  a base; and
  means, carried on the base, for connecting at least one first electrical conductor to the base;
  means, carried with the base, for electrically connecting a second electrical conductor to the jaw contact:
a plurality of terminals mounted in the terminal portion, each terminal including:
  a collar having a through bore and an aperture intersecting the through bore; and
  a terminal clip having first and second ends, the first end disposed in the through bore in the collar; and
  a threaded fastener engagable through the aperture in the collar with the first end of the terminal clip to connect an external electrical conductor between the first end of the terminal clip and the terminal collar;
a cover disposed over the terminal portion of the housing;
a plurality of apertures formed in the cover, one threaded fastener aligned with one aperture; and
channel means, formed in the housing, for slidably receiving one terminal collar.

21. A watthour meter socket adapter electrically receiving blade terminals of a watthour meter, the socket adapter comprising:
a housing including a meter receiving portion, the meter receiving portion formed of first and second plates and an annular side wall extending between the first and second plates, the first and second plates spaced apart to define a cavity therebetween, the at least one electrical conductor and the jaw contacts disposed in the cavity and substantially enclosed by the first and second plates and the annular side wall;
a terminal portion spaced from the meter receiving portion;
a plurality of jaw contacts mounted in the meter receiving portion;
at least one jlaw contact including:
  a base; and
  means, carried on the base, for connecting at least one first electrical conductor to the base; and
  means, carried with the base, for electrically connecting a second electrical conductor to the jaw contact;
means, disposed in the housing, for covering substantially all of the electrical conductors and the law contacts, the covering means including a plurality of apertures, one aperture disposed adjacent each jaw contact for receiving a blade terminal of a meter therethrough; and
a plurality of terminal clips;
a plurality of support posts carried on the second plate, each support post engaging one terminal clip for supporting the one terminal clip in a stationary position relative to the second plate; and
at least one rib mounted on the first plate in engagement with the one terminal clip and co-acting with one support post for retaining the terminal clip in a stationary position relative to the first and second plates.

22. A watthour meter socket adapter electrically receiving blade terminals of a watthour meter, the socket adapter comprising:
a housing including a meter receiving portion;
a terminal portion spaced from the meter receiving portion;
a plurality of jaw contacts mounted in the meter receiving portion;
at least one jaw contact including:
  a base; and
  means, carried on the base, for connecting a first electrical conductor to the base;
  means, carried with the base, for electrically connecting a second electrical conductor to the jaw contact;
at least one first electrical conductor extending between one jaw contact and one terminal;
a terminal clip mounted on an end of the at least one first electrical conductor connected to the terminal;
means for fixedly supporting the terminal clip in the housing;
at least one hollow conductive sleeve mounted in the housing;
  an aperture formed in one end of the at least one conductive sleeve; and
  a second end of the at least one conductive sleeve electrically coupled to one terminal clip.

23. The watthour meter socket adapter of claim 22 further comprising:
a plug including a body having at least one pin extending therefrom;
the at least one pin insertable through the aperture in the first plate into electrical engagement with the conductive sleeve.

24. The watthour meter socket adapter of claim 22 further comprising:
a plurality of jaw contacts;
a plurality of terminal clips, one terminal clip connected by one conductor to one jaw contact; and
means, insertible into the conductive sleeves of two terminal clips, for electrically connecting the a two terminal clips, and the electrical conductors connected thereto.

25. The watthour meter socket adapter of claim 24 wherein the electrically connecting means comprises:
a plug including at least one pair of pins extending therefrom;
means, carried by the plug, for electrically connecting the pair of pins; and wherein
the pair of pins are insertable through the apertures in the first plate into electrical engagement with the two conductive sleeves to electrically (couple the conductors in the housing connected to the terminals and the conductive sleeves engaged by the pins.

26. A watthour meter socket adapter electrically receiving blade terminals of a watthour meter the socket adapter comprising:
a housing including a meter receiving portion, and a terminal portion spaced from the meter receiving portion;
a plurality of jaw contacts mounted in the meter receiving portion;
a plurality of terminals mounted in the terminal portion; and
electrical conductors extending between at least one jaw contact and at least one terminal;
the terminals including:
  a collar having a through bore and an aperture intersecting the through bore;
  a terminal clip having first and second ends, the first end disposed in the through bore in the collar;
  a threaded fastener engagable through the aperture in the collar with the first end of the terminal clip to connect an external electrical conductor between the first end of the terminal clip and the terminal collar;

means, carried on the second end of the terminal clip, for connecting at least one of the electrical conductors to the terminal clip; and means for fixedly supporting the terminal clip in the terminal portion of the housing.

27. The watthour meter socket adapter of claim 26 wherein the terminal clip further comprises:

at least one tab formed on the terminal clip intermediate the first and second ends of the terminal clip, the at least one tab engaging the support means.

28. The watthour meter socket adapter of claim 27 further comprising:

means, disposed in the housing, for covering substantially all of the electrical conductors and the jaw contacts, covering means including a plurality of apertures, one aperture disposed adjacent each jaw contact for receiving a blade terminal of a meter therethrough.

29. The watthour meter socket adapter of claim 28 wherein the covering means comprises:

the meter receiving portion formed of first and second plates and an annular side wall extending between the first and second plates, the first and second plates spaced apart to define a cavity therebetween, the at least one electrical conductor and the jaw contacts disposed in the cavity and substantially enclosed by the first and second plates and the annular side wall.

30. The watthour meter socket adapter of claim 26 further comprising:

a cover disposed over the terminal portion of the housing;

a plurality of apertures formed in the cover, one threaded fastener aligned with one aperture;

channel means, formed in the housing, for slidably receiving one terminal collar; and the apertures in the cover having a diameter permitting access to the threaded fastener to threadingly rotate the threaded fastener while preventing passage of the threaded fastener through the apertures.

31. The watthour meter socket adapter of claim 26 further comprising:

a cover disposed over the terminal portion of the housing;

a plurality of apertures formed in the cover, one threaded fastener aligned with one aperture; and channel means, formed in the housing, for slidably receiving one terminal collar.

32. The watthour meter socket adapter of claim 30 further comprising:

a plurality of support posts carried on the second plate, each support post engaging one terminal clip for supporting the terminal clip in a stationary position relative to the second plate; and at least one rib mounted on the first plate in engagement with one terminal clip and co-acting with one support post for retaining the terminal clip in a stationary position relative to the first and second plates.

33. A watthour meter socket adapter electrically receiving blade terminals of a watthour meter the socket adapter comprising:

a housing including a meter receiving portion, and a terminal portion spaced from the meter receiving portion;

a plurality of jaw contacts mounted in the meter receiving portion;

a plurality of terminals mounted in the terminal portion; and electrical conductors extending between at least one jaw contact and at least one terminal;

the terminals including:

a collar having a through bore and an aperture intersecting the through bore;

a terminal clip having first and second ends, the first end disposed in the through bore in the collar;

a threaded fastener engagable through the aperture in the collar with the first end of the terminal clip to connect an external electrical conductor between the first end of the terminal clip and the terminal collar;

the terminal clip including:

means, carried on the second end of the terminal clip, for connecting at least one of the electrical conductors to the terminal clip; and at least one tab formed on the terminal clip intermediate the first and second ends of the terminal clip;

means, disposed in the housing, for covering substantially all of the electrical conductors and the jaw contacts, covering means including a plurality of apertures, one aperture disposed adjacent each jaw contact for receiving a blade terminal of a meter therethrough;

the covering means including the meter receiving portion formed of first and second plates and an annular side wall extending between the first and second plates, the first and second plates spaced apart to define a cavity therebetween, the at least one electrical conductor and the jaw contacts disposed in the cavity and substantially enclosed by the first and second plates and the annular side wall;

a plurality of spaced dividers formed on the first plate; and flange means formed on at least one of the dividers and forming a channel for receiving the at least one tab on the terminal clip.

34. The watthour meter socket adapter of claim 33 further comprising:

a plurality of support posts carried on the second plate, each support post engaging an intermediate portion of one terminal clip for supporting the terminal clip in a stationary position relative to the second plate.

35. The watthour meter socket adapter of claim 33 further comprising:

guide means, formed on the second plate, for guiding external electrical conductors into the terminal collar.

36. The watthour meter socket adapter of claim 35 wherein:

the guide means are spaced from the support posts, each support post limiting the length of insertion of an external electrical conductor into each terminal collar.

37. The watthour meter socket adapter of claim 36 further comprising:

dividers disposed between the guide means when the first and second plates are joined together.

38. A watthour meter socket adapter electrically receiving blade terminals of a watthour meter the socket adapter comprising:

a housing including a meter receiving portion. and a terminal portion spaced from the meter receiving portion;

a plurality of jaw contacts mounted in the meter receiving portion;

a plurality of terminals mounted in the terminal portion; and electrical conductors extending between at least one jaw contact and at least one terminal;

the terminals including:
  a collar having a through bore and an aperture intersecting the through bore;
  a terminal clip having first and second ends, the first end disposed in the through bore in the collar;
  a threaded fastener engagable through the aperture in the collar with the first end of the terminal clip to connect an external electrical conductor between the first end of the terminal clip and the terminal collar;
at least one pair of hollow conductive sleeves mounted in the terminal portion of the housing;
an aperture in the terminal portion alignable with one end of each conductive sleeve;
each conductive sleeve electrically coupled to one terminal clip; and
means, insertible into the at least one pair of sleeves, for electrically connecting the two terminal clips, and electrical conductors connected thereto, connected to the at least one pair of sleeves.

39. The watthour meter socket adapter of claim 38 wherein the electrically connecting means comprises:
  a plug including at least one pair of pins extending therefrom;
  means, carried by the plug, for electrically connecting the pair of pins; and wherein
  the pair of pins are insertable through the apertures in the first plate into electrical engagement with the conductive sleeves to electrically couple the conductors in the housing connected to the terminals with the conductive sleeves engaged by the pins.

40. A watthour meter socket adapter electrically receiving blade terminals of a watthour meter, the socket adapter comprising:
  a housing including a meter receiving portion, the meter receiving portion being formed of first and second plates and an annular side wall extending between the first and second plates, the first and second plates spaced apart to define a cavity therebetween;
  a terminal portion spaced from the meter receiving portion;
  a first electrical conductor;
  at least one jaw contact including:
    a base;
    means, carried on the base, for connecting the first electrical conductor to the base;
    the first electrical conductor and the at least one jaw contact disposed in the cavity and substantially enclosed by the first and second plates and the annular side wall;
  one aperture formed in the first plate and disposed adjacent the at least one jaw contact for receiving a blade terminal of a meter therethrough;
  means for supporting the jaw contacts in the housing, the supporting means including:
    a plurality of spaced dividers carried on the second plate; and
    flange means, carried on the second plate spaced from each divider and defining a slot in conjunction with one divider, for receiving the base of one jaw contact therein.

41. A watthour meter socket adapter electrically receiving blade terminals of a watthour meter, the socket adapter comprising:
  a housing including a meter receiving portion;
  a terminal portion spaced from the meter receiving portion;
  a plurality of jaw contacts mounted in the meter receiving portion;
  at least one jaw contact including:
    a base; and
    means, carried on the base, for connecting a first electrical conductor to the base;
  a plurality of terminals mounted in the terminal portion, each terminal including:
    a collar having a through bore and an aperture intersecting the through bore; and
    a terminal clip having first and second ends, the first end disposed in the through bore in the collar; and
    a threaded fastener engageable through the aperture in the collar with the first end of the terminal clip to connect an external electrical conductor between the first end of the terminal clip and the terminal collar;
  the terminal clip further including:
    means, carried on the second end of the terminal clip for connecting one electrical conductor to the terminal clip; and
    tab means, formed on the terminal clip intermediate the first and second ends of the terminal clip, for positioning the terminal clip in the housing.

42. A watthour meter socket adapter electrically receiving blade terminals of a watthour meter, the socket adapter comprising:
  a housing including a meter receiving portion;
  a terminal portion s from the meter receiving portion;
  a plurality of maw contacts mounted in the meter receiving portion;
  at least one jaw contact including:
    a base; and
    means, carried on the base, for connecting at least one first electrical conductor to the base;
  a plurality of terminals mounted in the terminal portion, each terminal including:
    a collar having a through bore and an aperture intersecting the through bore; and
    a terminal clip having first and second ends, the first end disposed in the through bore in the collar; and
    a threaded fastener engageable through the aperture in the collar with the first end of the terminal clip to connect an external electrical conductor between the first end of the terminal clip and the terminal collar;
  at least one tab formed on the terminal clip intermediate the first and second ends of the terminal clip;
  a plurality of spaced dividing formed on the housing; and
  flange means, formed on at least one of the dividers and forming a channel, for receiving the at least one tab on the terminal clip.

43. A watthour meter socket adapter electrically receiving blade terminals of a watthour meter, the socket adapter comprising:
  a housing including a meter receiving portion, the meter receiving portion formed of first and second plates and an annular sidewall extending between the first and second plates, the first and second plates spaced apart to define a cavity therebetween, the at least one electrical conductor and the jaw contacts disposed in the cavity and substantially enclosed by the first and second plates and the annular side wall;
  a terminal portion spaced from the meter receiving portion;

a plurality of jaw contacts mounted in the meter receiving portion;

at least one jaw contact including:
   a base; and
   means, carried on the base, for connecting at least one first electrical conductor to the base; and means disposed in the housing, for covering substantially all of the electrical conductors and the apertures, one aperture disposed adjacent each jaw contact for receiving a blade terminal of a meter therethrough; and a plurality of terminal clips;

a plurality or support posts carried on the second plate, each support post engaging one terminal clip for supporting the one terminal clip in a stationary position relative to the second plate; and at least one rib mounted on the first plate in engagement with the one terminal clip and co-acting with one support post for retaining the terminal clip in a stationary position relative to the first and second plates.

* * * * *